United States Patent
Bude et al.

(10) Patent No.: US 7,297,569 B2
(45) Date of Patent: Nov. 20, 2007

(54) SEMICONDUCTOR DEVICES WITH REDUCED ACTIVE REGION DEFECTS AND UNIQUE CONTACTING SCHEMES

(75) Inventors: Jeff Devin Bude, Danville, CA (US); Malcolm Carroll, Albuquerque, NM (US); Clifford Alan King, New York, NY (US)

(73) Assignee: Noble Device Technologies Corporation, Newark, NJ (US)

( * ) Notice: Subject to any disclaimer, the term of this patent is extended or adjusted under 35 U.S.C. 154(b) by 1 day.

(21) Appl. No.: 11/269,017

(22) Filed: Nov. 8, 2005

(65) Prior Publication Data

US 2006/0057825 A1 Mar. 16, 2006

Related U.S. Application Data

(62) Division of application No. 10/453,037, filed on Jun. 3, 2003, now Pat. No. 7,012,314.

(60) Provisional application No. 60/434,359, filed on Dec. 18, 2002.

(51) Int. Cl.
*H01L 21/00* (2006.01)
(52) U.S. Cl. .............................. 438/57; 438/73; 438/77
(58) Field of Classification Search ................ 438/57, 438/63, 65, 66, 69, 73, 75, 77, 78
See application file for complete search history.

(56) References Cited

U.S. PATENT DOCUMENTS

| | | |
|---|---|---|
| 5,371,033 A | 12/1994 | Lee et al. |
| 6,396,046 B1 | 5/2002 | Possin et al. |
| 6,489,631 B2 * | 12/2002 | Young et al. .................. 257/59 |

(Continued)

FOREIGN PATENT DOCUMENTS

EP 0 951 055 A 10/1999

(Continued)

OTHER PUBLICATIONS

S. Nakamura et al., InGaN . . . , Jpn. J. Appl. Phys., vol. 36, Part 2, No. 12A, pp. L1568-L1571 (Dec. 1997).

(Continued)

*Primary Examiner*—Kevin M. Picardat
(74) *Attorney, Agent, or Firm*—Lerner, David, Littenberg, Krumholz & Mentlik, LLP

(57) ABSTRACT

A method of making a semiconductor device having a predetermined epitaxial region, such as an active region, with reduced defect density includes the steps of: (a) forming a dielectric cladding region on a major surface of a single crystal body of a first material; (b) forming a first opening that extends to a first depth into the cladding region; (c) forming a smaller second opening, within the first opening, that extends to a second depth greater than the first depth and that exposes an underlying portion of the major surface of the single crystal body; (d) epitaxially growing regions of a second semiconductor material in each of the openings and on the top of the cladding region; (e) controlling the dimensions of the second opening so that defects are confined to the epitaxial regions grown within the second opening and on top of the cladding region, a first predetermined region being located within the first opening and being essentially free of defects; (f) planarizing the top of the device to remove all epitaxial regions that extend above the top of the cladding layer, thereby making the top of the first predetermined region grown in the second opening essentially flush with the top of the cladding region; and (g) performing additional steps to complete the fabrication of the device. Also described are unique devices, such as photodetectors and MOSFETs, fabricated by this method, as well as unique contacting configurations that enhance their performance.

39 Claims, 21 Drawing Sheets

U.S. PATENT DOCUMENTS

| | | | |
|---|---|---|---|
| 6,784,032 B2 * | 8/2004 | Lee et al. ................... | 438/149 |
| 7,094,624 B2 * | 8/2006 | Park et al. ................... | 438/82 |
| 7,098,069 B2 * | 8/2006 | Yamazaki et al. ............ | 438/24 |
| 2001/0052597 A1 | 12/2001 | Young et al. | |
| 2002/0163023 A1 | 11/2002 | Milda | |
| 2003/0016311 A1 | 1/2003 | Sato et al. | |
| 2003/0103150 A1 | 6/2003 | Catrysee et al. | |
| 2004/0012029 A1 | 1/2004 | Bawolek et al. | |

FOREIGN PATENT DOCUMENTS

| | | |
|---|---|---|
| EP | 1 005 068 A | 5/2000 |
| JP | 2000-340783 A | 12/2000 |
| JP | 2001-267544 | 9/2001 |
| WO | WO-99/44224 A | 9/1999 |
| WO | WO-02/090625 | 11/2002 |

OTHER PUBLICATIONS

M.T. Currie et al., Controlling threading . . . , Appl. Phys. Lett., vol. 72, No. 14, pp. 1718-1720 (Apr. 1998).

H-C. Luan et al., High-quality Ge . . . , Appl. Phys. Lett., vol. 75, No. 19, pp. 2909-2911 (Nov. 1999).

G. Masini et al., Highly responsivity . . . , Electr. Lett., vol. 35, No. 17, pp. 1467-1468 (Aug. 1999).

G. Masini et al., High Performance . . . , IEEE Trans. on Electr. Dev., vol. 48, No. 6, pp. 1092-1096 (Jun. 2001).

L. Colace et al., Efficient high speed . . . , Appl. Phys. Lett., vol. 76, No. 10, pp. 1231-1233 (Mar. 2000).

L. Colace et al., Metal-semiconductor . . . , Appl. Phys. Lett., vol. 72, No. 24, pp. 3175-3177 (Jun. 1998).

T.A. Langdo et al., High quality Ge on Si . . . , Appl. Phys. Lett., vol. 76, No. 25, pp. 3700-3702 (Jun. 2000).

O-H Nam et al., Lateral epitaxy . . . , Apply. Phys. Lett., vol. 71, No. 18, pp. 2638-2640 (Nov. 1997).

J.D. Schaub et al., Resonant-cavity . . . , IEEE Photonic Tech. Lett., vol. 11, No. 12, pp. 1647-1648 (Dec. 1999).

H.C. Lee et al., A Novel High-Speed . . . , IEEE Electr. Dev. Lett., vol. 16, No. 5, pp. 175-177 (May 1995).

S.B. Samavedam et al., High-quality germanium . . . , Appl. Phys. Lett., vol. 73, No. 15, pp. 2125-2127 (Oct. 1998).

Langdo, T.A. et al., "High Quality Ge on Si by Epitaxial Necking," Applied Physics Letters, vol. 76, No. 25, Jun. 19, 2000, p. 3700-3702.

* cited by examiner

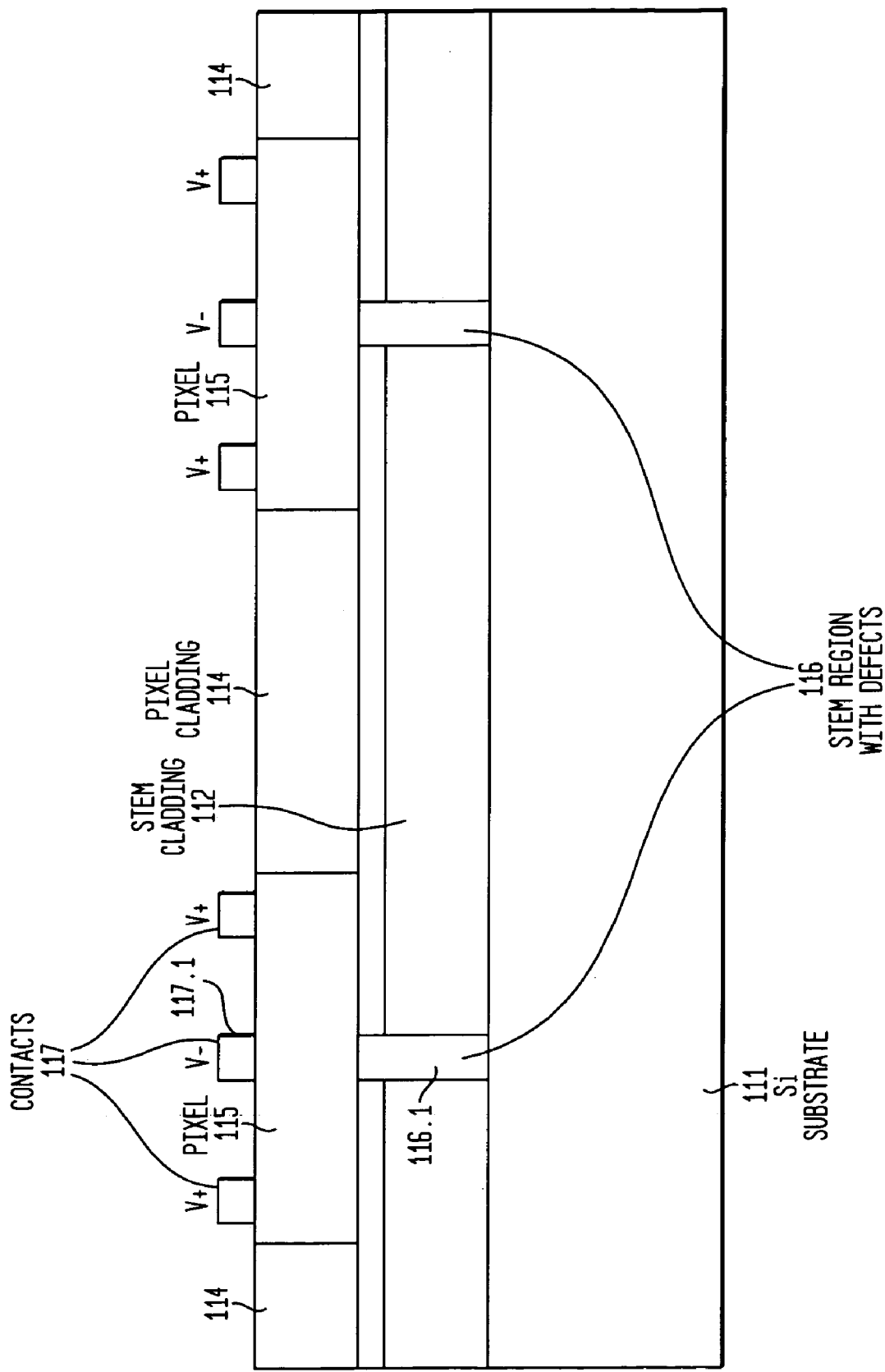

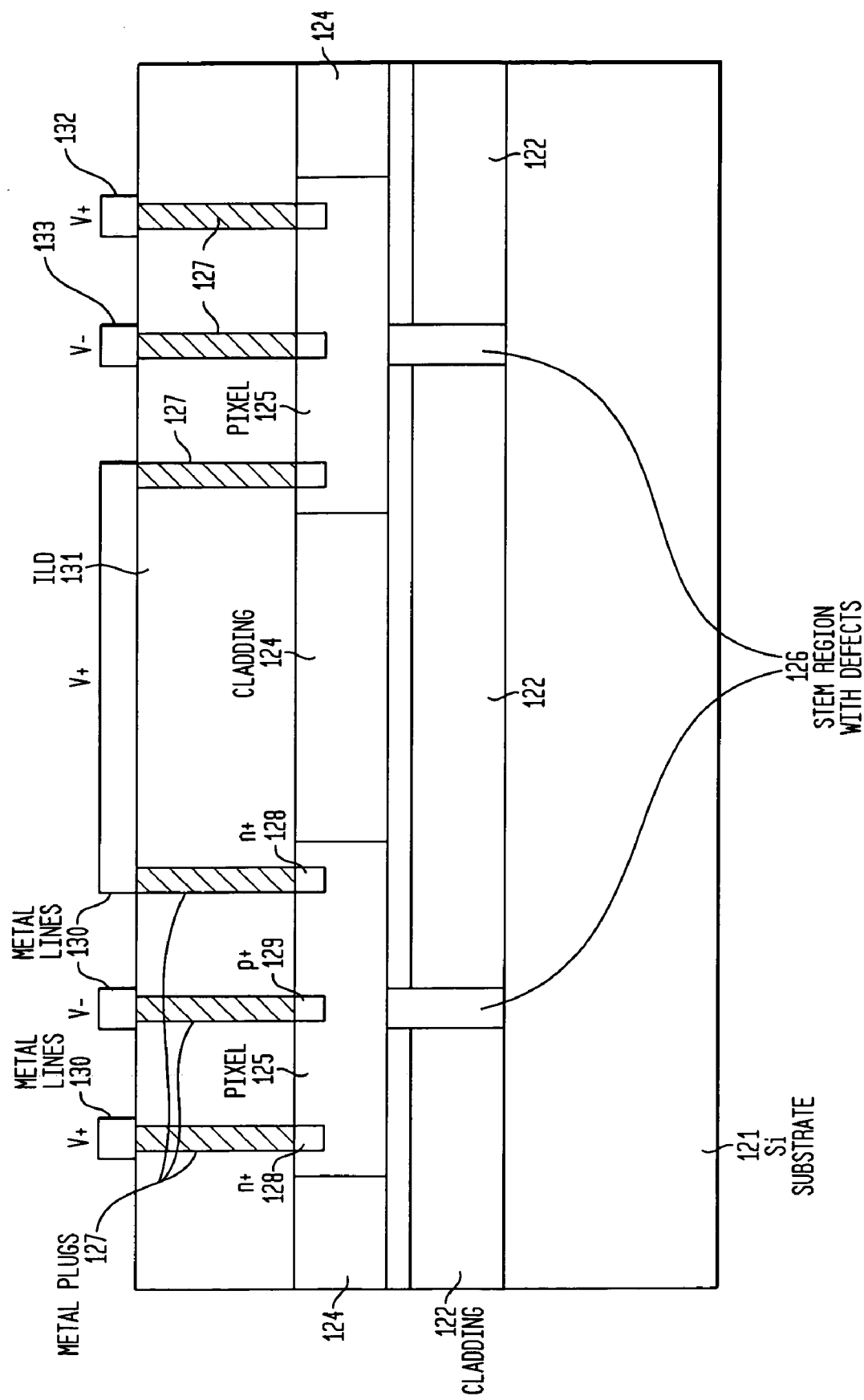

SEMICONDUCTOR DEVICES WITH REDUCED ACTIVE REGION DEFECTS AND UNIQUE CONTACTING SCHEMES

CROSS-REFERENCE TO RELATED APPLICATIONS

This application is a divisional of U.S. patent application Ser. No. 10/453,037 filed Jun. 3, 2003 now U.S. Pat. No. 7,012,314, which claims the benefit of U.S. Provisional Patent Application Ser. No. 60/434,359 filed Dec. 18, 2002, the disclosures of which are hereby incorporated herein by reference.

BACKGROUND OF THE INVENTION

1. Field of the Invention

This invention relates to semiconductor devices that have reduced active region defects and to semiconductor devices that have unique contacting schemes.

2. Discussion of the Related Art

Optical communication systems use near infrared (IR) radiation at wavelengths ranging from about 800 nm to 1600 nm. In particular, important communication bands are around 850 nm for short-range fiber optic communication links and around 1310 nm and 1550 nm for longer-range fiber optic communication links.

Group III-V compound semiconductor photo-detectors (PDs) are currently the photodetectors of choice for optical communications receivers because GaAs-based and InP-based materials are good near IR absorbers. These detectors have absorption lengths ($L_{abs}$) of about 1 µm or less over the wavelength band of 800 nm to 1600 nm.

Notwithstanding some of the desirable characteristics of Group III-V detectors, it would be advantageous to fabricate PDs in Si-based systems for two reasons: cost and functionality. Whereas Group III-V-based processing is low yield and expensive, Si-based processing is ubiquitous and low cost. Due to its high device yield, Si is the material of choice to realize complex electronic functionality. Low cost optoelectronic subsystems are possible in Si.

Unfortunately Si is a poor absorber in the IR range of practical interest (e.g., 1100-1600 nm). Si IR detectors for communications can be used only near 850 nm, but even there the absorption length ($L_{abs}$) of Si is relatively large, greater than 20 µm. Absorption length impacts two important PD properties: quantum yield and frequency response. Quantum yield (QY) is the fraction of incident optical power absorbed by the detector. As light passes through a material of thickness T with a given $L_{abs}$, the amount of light absorbed is $\exp(-T/L_{abs})$. In order to achieve high QY it is desirable that the thickness of the PD absorption region be greater than or equal to $L_{abs}$ at the wavelength of operation of the particular system.

Frequency response is quantified by the 3 dB frequency ($f_3$). QY and $f_3$ determine the maximum data rate at which the PD can accurately detect. A QY of at least 50% is desirable, and $f_3$ must be larger than half the data rate. Important data rates for commercial IR communication channels are 2.5 GHz, 10 GHz and 40 GHz. Therefore, a minimum of $f_3$=2.5 GHz is required for these relatively high-speed systems. On the other hand, lower speed detectors are useful in some less demanding applications such as IR cameras and wireless IR systems.

One prior art method employed to address the poor IR properties of Si is to monolithically integrate it with materials that have higher IR absorption. The material of choice for such integration is $Si_{1-x}Ge_x$, an alloy of Si and Ge having a Ge concentration (molar fraction) of x in Si. Significantly, $Si_{1-x}Ge_x$ processing is compatible with Si processing.

FIG. 1a compares the absorption length of pure Ge ($Si_{1-x}Ge_x$ with x=1) with that of Si and InGaAsP, a standard Group III-V compound semiconductors used in PDs. $L_{abs}$ in Ge is below 2 µm for the entire wavelength range of interest (e.g., 1300-1600 nm). When the Ge concentration of $Si_{1-x}Ge_x$ is such that 0<x<1, the absorption is intermediate between that of Si and Ge. To reach the longer wavelengths from 1310 nm to 1550 nm, nearly pure Ge with x nearly equal to 1 is ideal (e.g., x~0.8-0.9). However, the thickness of a high quality (low defect density) single crystal $Si_{1-x}Ge_x$ layer that can be grown on a single crystal Si substrate or on a Si epitaxial layer is limited by the 4% lattice constant mismatch between Si and Ge. (See FIG. 1b where the curve represents critical layer thickness as a function of Ge concentration.). A $Si_{1-x}Ge_x$ layer having a larger concentration of Ge has a smaller critical thickness. Layers grown above the critical thickness tend to contain misfit dislocations under equilibrium growth conditions; those grown below do not have misfit dislocations. These defects are a source of extrinsic leakage current (dark current) that adds to the noise of the detector, thereby limiting its overall sensitivity.

Dark current is the current that flows in the detector in the absence of a light signal. In the presence of defects it is proportional to the defect density. Defects also form recombination centers that diminish QY. In the absence of defects, the intrinsic dark current is proportional to $\exp[-EG(x)/kT]$, where $EG(x)$ is the bandgap of the absorbing layer, x is the mole fraction of Ge in $Si_{1-x}Ge_x$, k is Boltzmann's constant, and T is the lattice temperature. $EG(x)$ is a monotonically decreasing function of x, and so larger values of x result in larger intrinsic dark currents. For some applications at shorter wavelengths near 850 nm, a $Si_{1-x}Ge_x$ semiconductor having x<1 may be desirable since $L_{abs}$ is short enough and the intrinsic dark current would be lower. Applications at longer wavelengths require a value of x nearly equal to 1 (nearly pure Ge; e.g., x~0.8-0.9)). However, for any of the IR communication wavelengths of interest, the critical thickness of any $Si_{1-x}Ge_x$ semiconductor with enough Ge to be a good near IR absorber is much smaller than the absorption length in these materials. As a result, near IR $Si_{1-x}Ge_x$ PDs with sufficient performance cannot be made using prior art techniques to directly grow $Si_{1-x}Ge_x$ on Si.

Several approaches have been proposed in the prior art in attempts to circumvent the critical layer thickness problem, but they all use complicated growth schemes. For example, Ge PDs formed on Si have been reported in the literature using two approaches different approaches known as (1) the graded buffer (GB) method, and (2) the Si/Ge heterojunction (SGH) method.

Graded buffer (GB) method: As shown in FIG. 2a, the GB method involves growing and annealing a graded, multi-layered buffer region of $Si_{1-x}Ge_x$ on a single crystal Si substrate. [See, for example, M. T. Currie et al, *Appl. Phys. Lett.*, Vol. 72, No. 14, p. 1718 (1998), which is incorporated herein by reference.]. The concentration of Ge in the buffer region (layers 2-4) is varied monotonically from 0% at the interface with the Si substrate 1 to 100% in the Ge device active (absorbing) layer 6. Since the buffer layers 2-4 contain lower Ge concentration than the top Ge absorbing layer, almost all the light will be absorbed in the Ge layer 6. However, the total layer structure is difficult to integrate with conventional CMOS processing because the layer stack can become quite thick and the annealing steps involved require high temperatures. Also, the best results to date for the quality of the surface layer still incorporate a relatively large density (~$10^5$ cm$^{-2}$) of defects 7, which are schematically shown on only the right hand side of the structure for convenience only. In fact, the defects exist through out the graded region.

Si/Ge heterojunction (SGH) method: As shown in FIG. 2b, the SGH method involves direct growth of a pure Ge layer 9 on a single crystal Si substrate 8 followed by a complicated sequence of high temperature, cyclic annealing steps aimed at reducing the dislocation (defect) density in the Ge layer [See, for example, G. Masini et al. *Electronics Letters*, Vol. 35, No. 17, p. 1467 (1999) and H-C Luan, et al, *Appl. Phys. Lett.*, Vol. 75, No. 19, p. 2909 (1999), both of which are incorporated herein by reference.]. Like the GB process, this process poses challenges to CMOS integration due to required high temperature (900 C) anneals [See, L. Colace et al, *Appl. Phys. Lett.*, Vol. 76, No 10, p. 1231 (2000), which is incorporated herein by reference.] However, the best material obtained by this technique still has a relatively high defect density of $2\times10^6$ cm$^{-2}$.

Low-defect density (sometimes referred to as defect-free) material for device fabrication is important for reducing noise and increasing sensitivity in PDs. However, prior art techniques are not capable of producing low-defect-density Ge on Si. In addition, any defects are located in highly doped regions, such as the electrical contact regions, which are not depleted by the electric field. Heavy doping in the defect regions ensures that these regions remain electrically neutral under all bias conditions. Otherwise, generation-recombination current results in large reverse leakage (dark) current.

The region near the interface region 10 in FIG. 2b and the graded buffer regions 2-4 in FIG. 2a contain the most defects, as pointed out by G. Masini et al, *IEEE Trans on Elec. Dev.*, Vol. 48, No. 6, p. 1092 (2001), which is incorporated herein by reference. It is essential that these regions be highly doped; however, it is not possible to eliminate all of the defect-induced dark current by means of high doping because some region of low-doped Ge is required to absorb the incident light signal. Low doping in the absorbing region ensures that carrier transport is dominated by the fast drift mechanism rather than the slower diffusion process.

Both the GB and SGH methods have been used to form two common types of PDs: a vertical PIN PD (FIG. 3a) and a metal-semiconductor-metal (MSM) PD (FIG. 3b). Both PDs have been designed for use as surface-illuminated detectors in which the signal light impinges upon the top (or bottom) surface of the detector and essentially perpendicular to the primary layers of the device. However, it is possible to use these PDs as edge-illuminated devices in which signal light impinges on an edge of the device and propagates in a direction essentially parallel to the primary layers of the device.

The major conclusions described here pertain to both vertical PIN and MSM IR prior art detectors. These devices suffer from two important limitations: (1) process incompatibility with conventional CMOS processes, and (2) intrinsically poorer performance. In addition, it has not previously been appreciated that these limitations are inherent in the methods of the prior art.

Thus, a need remains in the art for a Si-based near IR PD that exhibits both high speed and high QY.

To clarify the limitations of the prior art the implementation schemes of both PIN and MSM devices have been analyzed. In the vertical PIN structure shown in FIG. 3a the substrate layer 14 is either a single crystal Si substrate or a $Si_{1-x}Ge_x$ buffer on such Si substrate. It is non-absorbing in the 1200-1600 nm band. The active device layer 12, where signal light absorption is intended, is undoped Ge. The top, highly doped contact layer 11 is also Ge. In the prior art GB method, the bottom, highly doped contact layer 13 is also Ge but in the prior art SGH method, it is Si. Signal light 19 is incident on the top surface 18. The light penetrates the device layers and is absorbed in the Ge active layer 12. Electron-hole pairs are created in Ge layers 11-13 of the GB method and in layers 11 and 12 of SGH method where they are separated by the electric field. The latter is generated by connecting a voltage source (not shown) with the indicated polarity across metal contacts 15 and 16. The detector photocurrent flows through a detection circuit (not shown) connected to contacts 15 and 16.

In both of these devices the thickness ($T_{12}$) of the absorption layer 12 is approximately greater than 1 μm, which is the absorption length for light between 1310 nm and 1550 nm, and QY is given by $\exp(-T_{12}/L_{abs})$. In a well-designed device, the frequency response is limited by the transit time of the photo-generated electrons and holes. Two different times are important in the vertical PIN structure: the drift time ($\tau_d$) in the high field (undoped active region 12) and the diffusion time ($\tau_{diff}$) of carriers generated in the low field (high doped contact regions 11 and 13). Because carriers are generated throughout the Ge layers, there is a distribution of transit times. Calculation of the exact frequency response is complicated, but readily done through simulation. However, a good feel for $f_3$ can be obtained by looking at the longest transit times, which limit the frequency response. The longest drift time is $\sim T_{12}/v_d$ where $v_d$ is the average drift velocity of carriers in the electric field of layer 12. The longest diffusion time is proportional to the square of the thickness (W) of the doped layer contact layer 11. The overall transit time ($\tau$) is approximately given by $\tau_d + \tau_{diff}$, and $f_3$ is then approximately $1/(2\pi\tau)$. Even for W on the order of 0.2 μm, the diffusion time can dominate the overall frequency response.

The MSM structure shown in FIG. 3b differs from the PIN structure in that the electric drift field is parallel to the top surface 28, whereas in the PIN structure of FIG. 3a it is perpendicular to the surface 18. Again the substrate 24 is a single crystal Si substrate in the SGH method and a graded buffer layer in the GB method. The absorption of signal light takes place in the Ge active layer 23. In this case, inter-digitated Schottky barrier electrodes 21 and 22 are disposed directly on the Ge top surface 28 from which the detector photocurrent flows. In this device the normally incident light penetrates the Ge layer 23 and is absorbed there creating electron-hole pairs. As in the vertical PIN structure, QY is determined by the Ge layer thickness $T_{23}$. The relevant transit time in the MSM structure is given approximately by $\tau_d \sim (T_{23}+D)/v_d$ where D is the spacing between adjacent electrodes. Unlike the PIN structure, the MSM device has no problem with carrier diffusion times because there are no highly doped, low field regions where carriers can be photo-generated.

The PIN structure is preferable to the MSM structure because the highly defective interfacial region 25 is not highly doped, and therefore the MSM has relatively large dark currents. For the same reason, in the PIN structure it is preferable to make the bottom contact layer 13 of Ge, as in the devices described using the GB method, in order to ensure that the defect interface 17 is highly doped. Although the prior art SGH method does not suggest forming the Si/Ge heterojunction between the bottom contact layer 13 and the substrate 14, there is no reason why this couldn't be done in principle. The resulting structure would then be electrically identical to the PIN formed using the GB method and would consequently have the same performance. Therefore, for comparison purposes in the following discussion, we need consider the limitations of only the best of these prior art devices: the PIN structure (FIG. 3a) formed using either the GB or SGH method in which the bottom contact layer 13 is Ge.

We have performed device simulations to assess the ideal device speed of the PIN structures discussed above and have found that the frequency response of these devices is inherently limited by transit time considerations. The results are reported in Table I, below.

TABLE I

| Absorption Regions of FIG. 3a PIN Detector | W (μm) | $T_{12}$ (μm) | $f_3$ (GHz) |
|---|---|---|---|
| (1) Regions 11, 12, and 13 | | | |
| 1st set of simulations | 0.2 | 2.0 | 7.0 |
| 1st set of simulations | 0.2 | 1.5 | 8.0 |
| 1st set of simulations | 0.2 | 1.0 | 8.5 |
| 1st set of simulations | 0.2 | 0.5 | 6.5 |
| 1st set of simulations | 0.2 | 0.3 | 5.2 |
| 1st set of simulations | 0.2 | 0.2 | 4.6 |
| 2nd set of simulations | 0.2 | 1.0 | 8.5 |
| 2nd set of simulations | 0.4 | 1.0 | 2.4 |
| 2nd set of simulations | 0.6 | 1.0 | 1.0 |
| (2) Region 12 only | | | |
| 3$^{rd}$ set of simulations | 0.2 | 2.0 | 8.9 |
| 3$^{rd}$ set of simulations | 0.2 | 1.5 | 11.0 |
| 3$^{rd}$ set of simulations | 0.2 | 1.0 | 18.0 |
| 3$^{rd}$ set of simulations | 0.2 | 0.5 | 36.0 |
| 3$^{rd}$ set of simulations | 0.2 | 0.3 | 61.0 |
| 3$^{rd}$ set of simulations | 0.2 | 0.2 | 92.0 |

Simulations were performed on idealized PIN structures as illustrated in FIG. 3a with voltages on contacts 15 and 16 that were large enough to result in saturated drift velocities in active region 12. The first set of results includes photo-generation in all Ge regions, which is what would occur naturally. In these simulations W has been fixed at 0.2 μm (a typical value for good contacting), and the high field region thickness $T_{12}$ has been varied. To make the detector fast, $T_{12}$ must be decreased, but it is clear from the table that as the ratio of W to $T_{12}$ increases, $f_3$ decreases. This relationship between $T_{12}$ and $f_3$ occurs because more of the carriers in the photocurrent response are limited by $\tau_{diff}$ than by $\tau_d$. The second set of simulations varies W but fixes $T_{12}$ at 1 μm, a value required to give a reasonable QY. Again, as the ratio of W to $T_{12}$ increases, $f_3$ decreases, this time with an approximate $1/W^2$ dependence, which is expected from diffusion-limited carrier transit. The third set of simulations artificially removes photo-generation in the contact regions 11 and 13 to demonstrate the impact of absorption in these n-type and p-type contact layers. In this case, $f_3$ is limited by carrier transit times in the active region 12 and increases linearly with $1/T_{12}$ as expected. It should be noted that in this structure it is not possible to reduce W indefinitely. W is required to be thick enough for good, low leakage contacting and to be thick enough to ensure that all of the defects that exist at the interface 17 between the Ge and Si are completely covered by high doping. If this interfacial region is depleted of free carriers, prohibitively large dark currents will flow adversely impacting the noise performance. Poor frequency response is the inherent problem in such prior art devices. If dark currents are controlled, highly doped contact regions must be formed in the Ge. But, this design results in a frequency response limited by the diffusion time $\tau_{diff}$.

Consequently, in the prior art devices it is very difficult to achieve high enough $f_3$ to satisfy the desired data rates of high-speed systems.

SUMMARY OF THE INVENTION

In accordance with one aspect of our invention, a method of making a semiconductor device having a predetermined epitaxial region, such as an active region, with reduced defect density includes the steps of: (a) forming a dielectric cladding region on a major surface of a single crystal body of a first material; (b) forming a first opening that extends to a first depth into the cladding region; (c) forming a smaller second opening, within the first opening, that extends to a second depth greater than the first depth and that exposes an underlying portion of the major surface of the single crystal body; (d) epitaxially growing regions of a second semiconductor material in each of the openings and on the top of the cladding region; (e) controlling the dimensions of the second opening so that defects are confined to the epitaxial regions grown within the second opening and on top of the cladding region, a first predetermined region being located within the first opening and being essentially free of defects; (i.e., less than about $10^3$ cm$^{-3}$); (f) planarizing the top of the device to remove all epitaxial regions that extend above the top of the cladding layer, thereby making the top of the first predetermined region grown in the second opening essentially flush with the top of the cladding region; and (g) performing additional steps to complete the fabrication of the device.

In accordance with several embodiments of our invention, the first material is Si and the second material is either $Si_{1-x}Ge_x$ (0<x≦1) or GaN.

In accordance with various other embodiments of our invention, the device may be optoelectronic or electronic. In the case of optoelectronic applications, the device is a photodetector in which the first predetermined region is the active region where signal light is absorbed and a second predetermined region is a waveguide that delivers signal light to the active region. In a preferred embodiment, such a photodetector has a SiGe active region formed on a Si substrate, and as such is compatible with Si IC processing, has high speed and high QY. The photodetector may be a surface illuminated array or an edge illuminated device in which light is directed to the active region by a suitable waveguide. In electronic applications, the device is illustratively a MOSFET in which the first predetermined region includes the channel, source and drain.

In accordance with another aspect of our invention, a semiconductor device comprises (a) a single crystal body of a first material; (b) a dielectric cladding region disposed on a major surface of the body and having a first opening that extends to a first depth and a smaller second opening, within the first opening, that extends to a second depth greater than the first depth and that exposes an underlying portion of the major surface; (c) first and second regions of a second semiconductor material filling the first and second openings, respectively, with the top of the first region being essentially flush with the top of the cladding region so as to form an active region in the first opening and a stem region in the second opening; and (d) the second opening having dimensions such that defects tend to be confined to the stem region, the first region being essentially free of defects.

In accordance with one embodiment of this aspect of our invention for use as a surface-illuminated PD, the device includes a multiplicity of active and stem regions, with signal light being absorbed in the active region to generate photocurrent, characterized in that at least one electrode is disposed on the active region so as to block any significant portion of signal light from being absorbed in the corresponding stem region.

In accordance with another embodiment of this aspect of our invention for use as a surface-illuminated PD, the device includes a multiplicity of active and stem regions, with signal light is absorbed in the active regions to generate photocurrent, characterized in that each of the active regions includes doped contact regions and a metallic blocking layer is disposed on at least one of the contact regions to reduce the amount of signal light that is absorbed by at least one contact region. In a preferred design of this embodiment, a metallic blocking layer covers more than about 30% of the surface area of the at least one contact region. In yet another preferred design of this embodiment, the absorbing layer completely covers at least one contact region and at least about 20% of the surface area of the corresponding active region. In still another preferred design of this embodiment, the volume of the doped contact regions is less than about 25% of the volume of the corresponding active region. In one more preferred design of this embodiment, the volume of each second region is less than about 25% of the volume of the corresponding active region.

In accordance with another embodiment of this aspect of our invention for use as an edge-illuminated PD, the width of the stem region (as measured transverse to the direction of light propagation) is less than half the wavelength of the signal light (as measured in the semiconductor material of the stem region), which serves to reduce penetration of the signal light therein.

In accordance with another embodiment of this aspect of our invention for use as an edge-illuminated PD, the active region is optically coupled to a waveguide region which transmits signal light to the active region, characterized in that the width of the waveguide region is less than the width of the active region and the center of the waveguide region is aligned with the center of the active region. In a preferred design of this embodiment, the width of the waveguide region is less than the distance between the inside edge of the active region and the stem region and the center of the waveguide region is aligned between the inside edge of the active region and the its stem region.

In accordance with another embodiment of this aspect of our invention for use as either a surface-illuminated PD or an edge-illuminated PD, the active regions are undoped, but the stem regions are doped, thereby to reduce dark current.

BRIEF DESCRIPTION OF THE DRAWINGS

Our invention, together with its various features and advantages, can be readily understood from the following more detailed description taken in conjunction with the accompanying drawing, in which:

FIG. 7a is a schematic, top view of a set of masks used to fabricate an array of devices of the type depicted in FIG. 6a;

FIG. 8a is a schematic, cross sectional view of a contacting scheme for a MSM PD in accordance with still another embodiment of our invention;

FIG. 8b is a schematic, cross sectional view of a contacting scheme for a lateral PIN PD in accordance with one more embodiment of our invention;

DETAILED DESCRIPTION

Fabrication Process

Before discussing in detail various device designs that can be realized using novel processes in accordance with one aspect of our invention, we first discuss the process as a general approach to fabricating relatively defect-free semiconductor active regions of devices such as PDs and MOSFETs. However, we concentrate in the exposition on the fabrication of low-defect-density absorption regions of SiGe PDs for operation at IR wavelengths of about 800-1600 nm for the purposes of illustration and as a reflection of one of the principal applications of our invention.

From our preceding discussion of prior art PDs, it is clear that we desire a device in which optical absorption occurs in high quality Ge, the majority of which is undoped or is depleted.

Figure 1A:
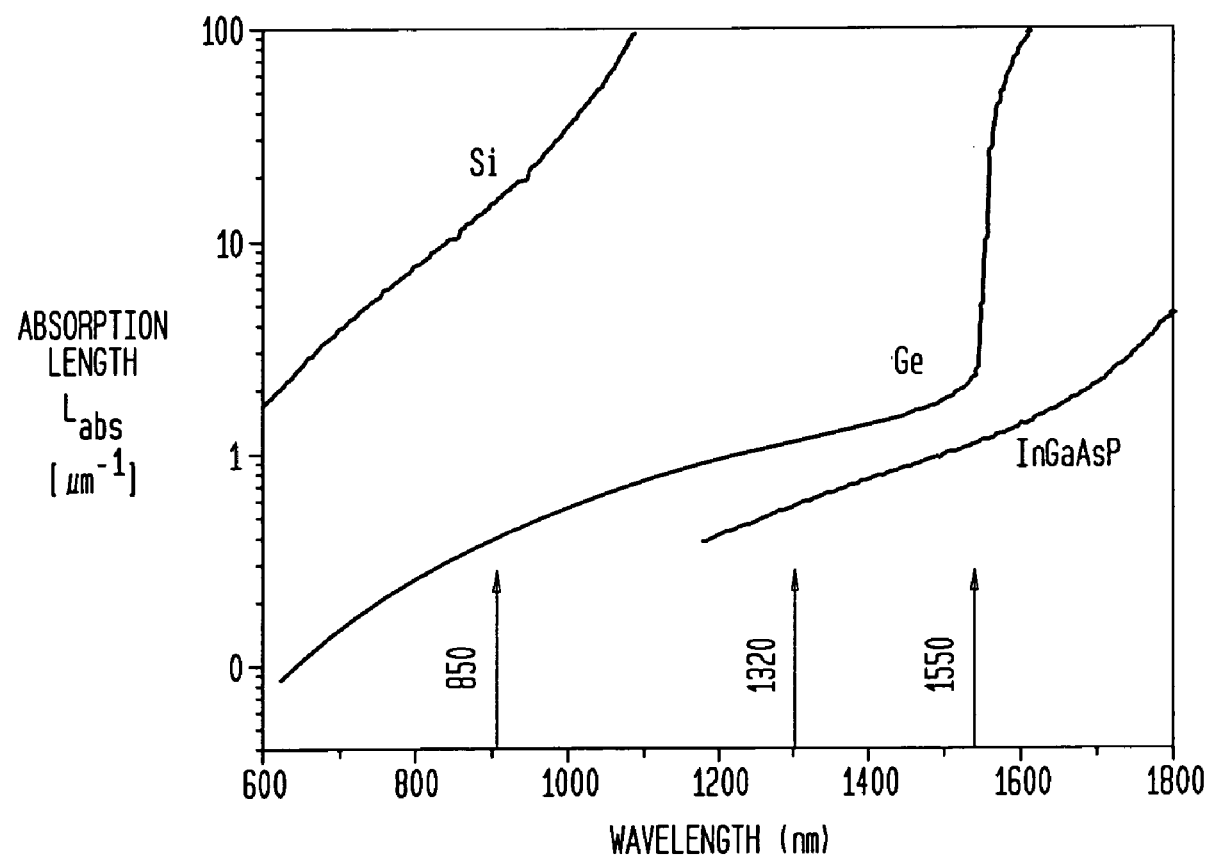
FIG. 1a is a graph showing the optical absorption length for Si, Ge and InGaAsP as a function of wavelength.
Figure 1B:
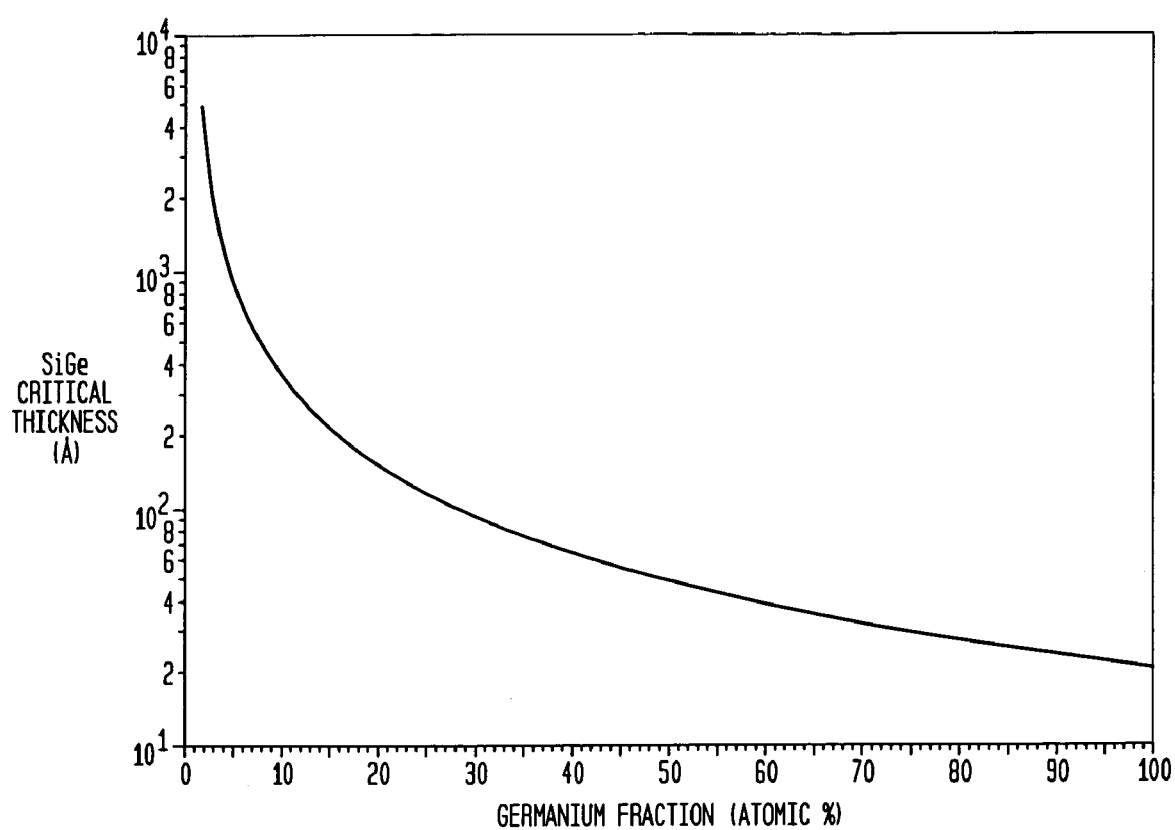
FIG. 1b is a graph of the critical thickness of a SiGe layer as a function of the mole fraction of Ge.
Figure 2A:
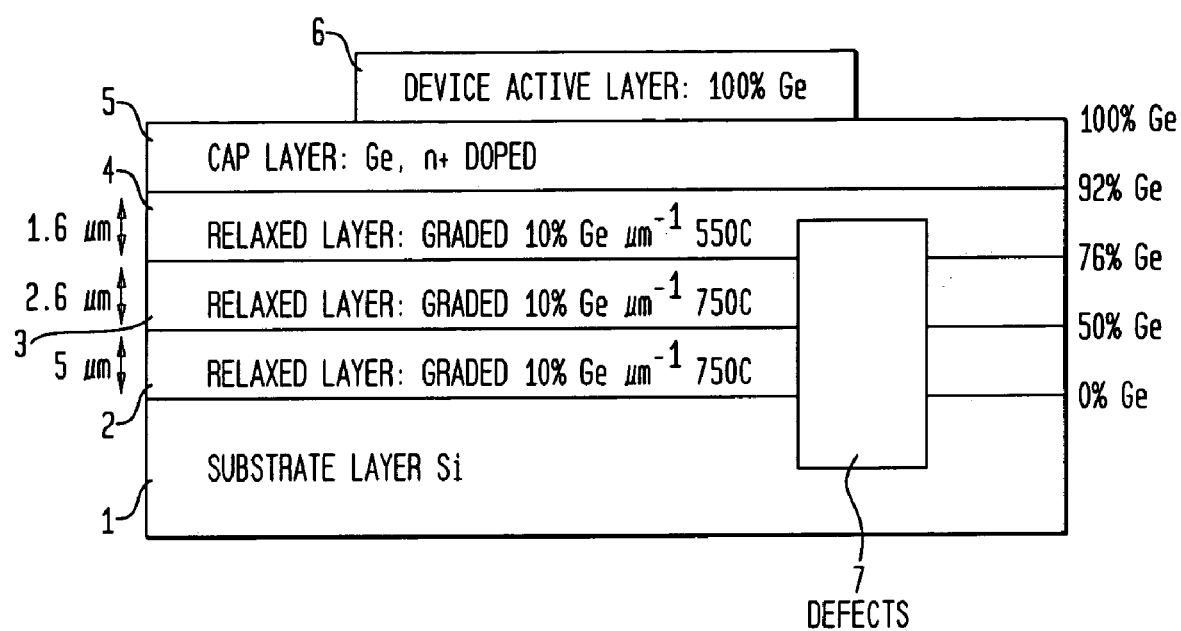
FIG. 2a is a schematic, cross sectional view of a prior art PD made by the GB method.
Figure 2B:
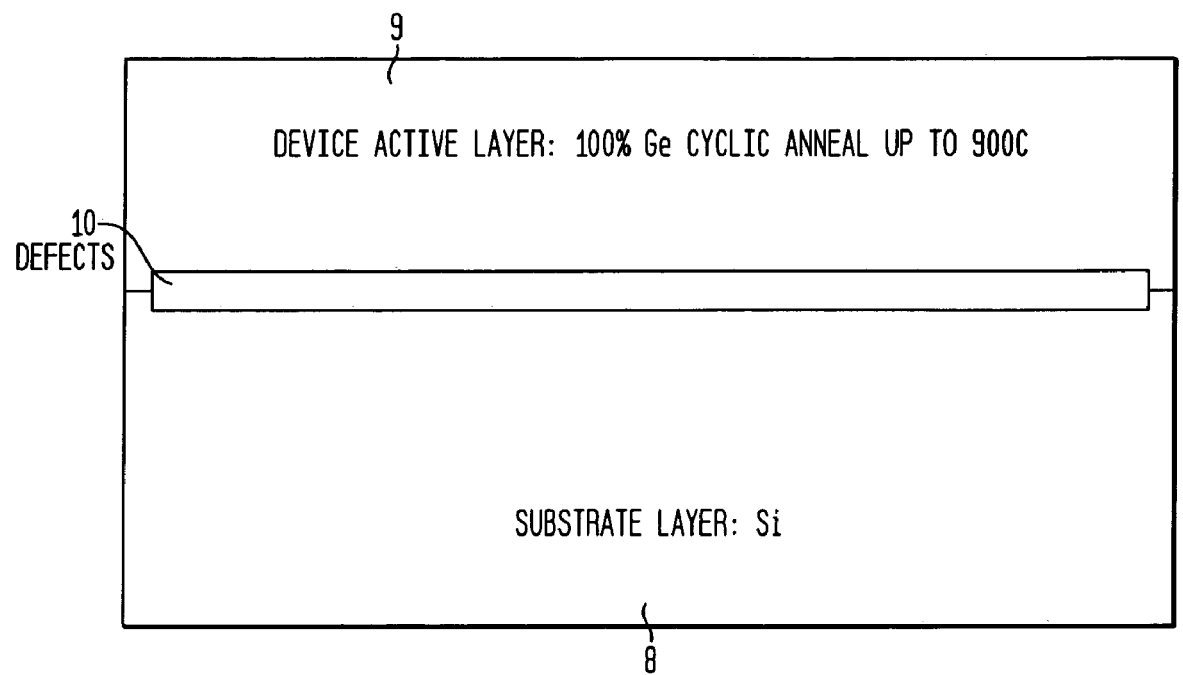
FIG. 2b is a schematic, cross sectional view of a prior art PD made by the SGH method.
Figure 3A:
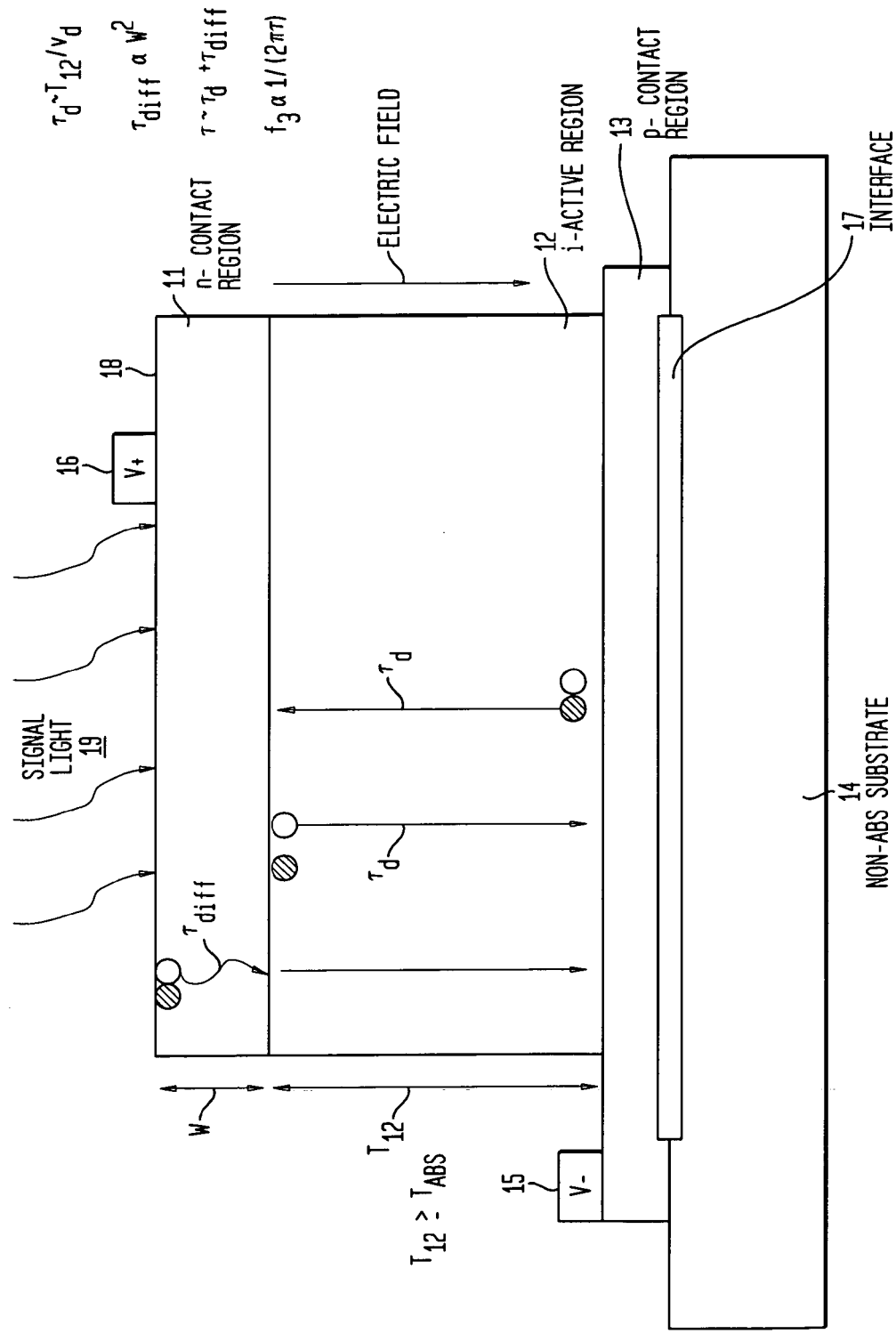
FIG. 3a is a schematic, cross sectional view of a prior art vertical PIN PD.
Figure 3B:
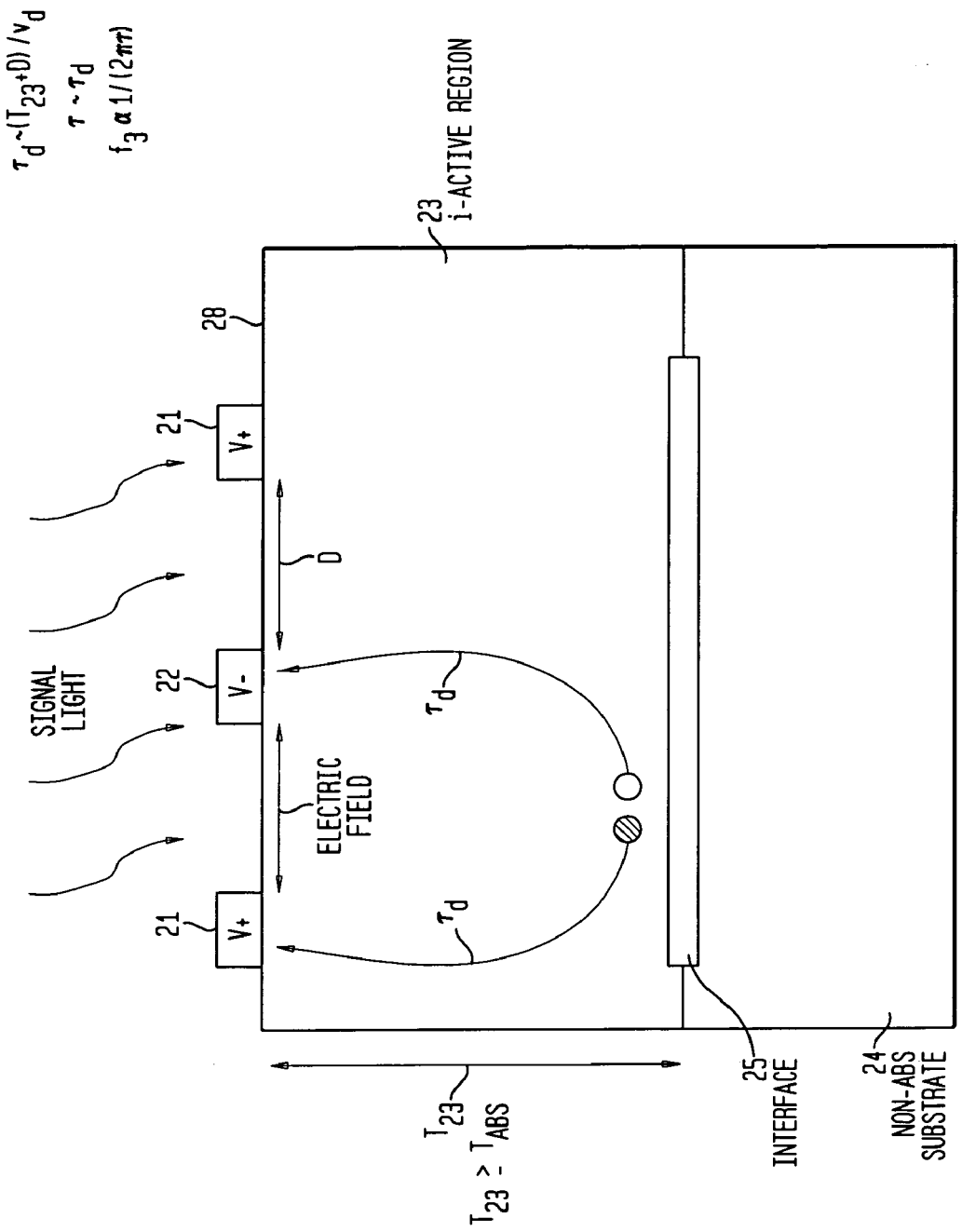
FIG. 3b is a schematic, cross sectional view of a prior art MSM PD.
Figure 4A:
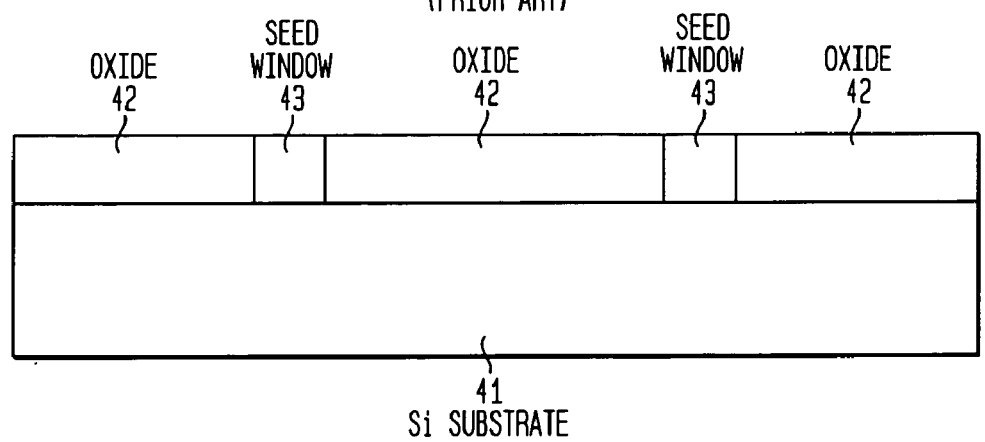
FIGS. 4a-4d are schematic, cross sectional views used to describe the salient process steps of an illustrative prior art ELO technique.
Figure 4B:
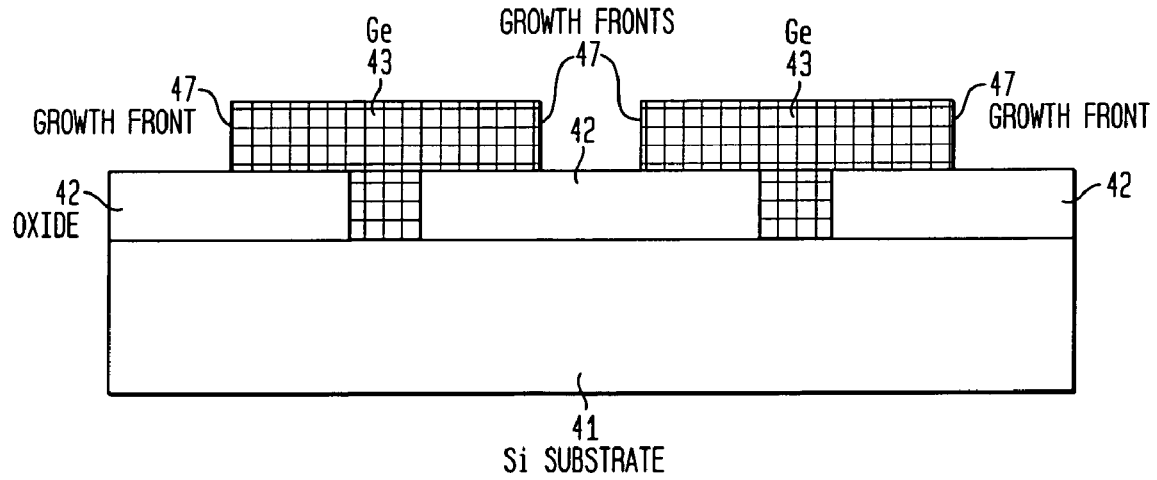
Figure 4C:
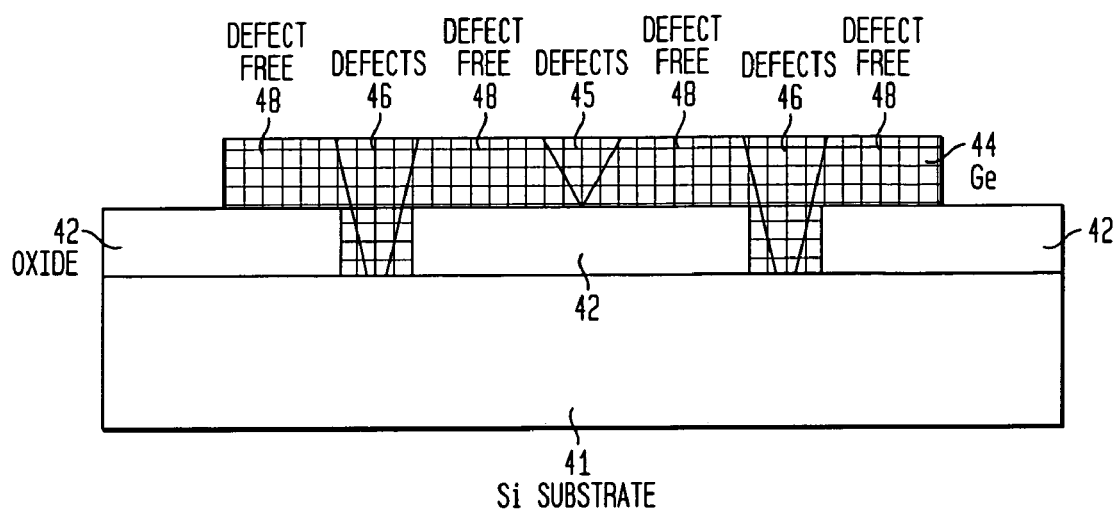

Our invention uses an epitaxial lateral overgrowth (ELO) technique to form high quality Ge embedded in an insulator structure that has been formed on top of a Si substrate. ELO has been used to monolithically integrate materials with dissimilar lattice constants such as GaN on Si [See, for example, O. Nam et al *Appl. Phys. Lett*, Vol. 71, No. 18, p. 2638 (1997) and S. Nakamura et al, *Jap. J. Appl. Phys.*, Vol. 36, No. 12A, Part 2, p. L1568 (1997), both of which are incorporated herein by reference.] and Ge over Si. The process of ELO for Ge over Si is detailed in FIGS. 4a-4c. Here, a thin insulator (e.g., oxide) layer 42 is formed on top of a single crystal Si substrate 41. Seed windows 43 are defined in the oxide lithographically and opened by etching down to the Si. The exposed Si surface is cleaned for Ge growth. Then, selective CVD growth takes place with Ge 43 growing only on the exposed Si (FIG. 4b). The growth continues until the Ge overgrows the seed window, and the growth fronts 47 from neighboring seed windows coalesce to form a continuous film (FIG. 4c). Large defect densities are found in only two parts of the resulting Ge film: as shown in FIG. 4c defects 46 thread from the Si interface at the bottom of the seed window up to the top of the film over the seed window, and defects 45 form at the region where two growth fronts meet. The majority of the Ge layer over the oxide mask is essentially defect free, as shown at 48 of FIG. 4c.

Figure 4D:
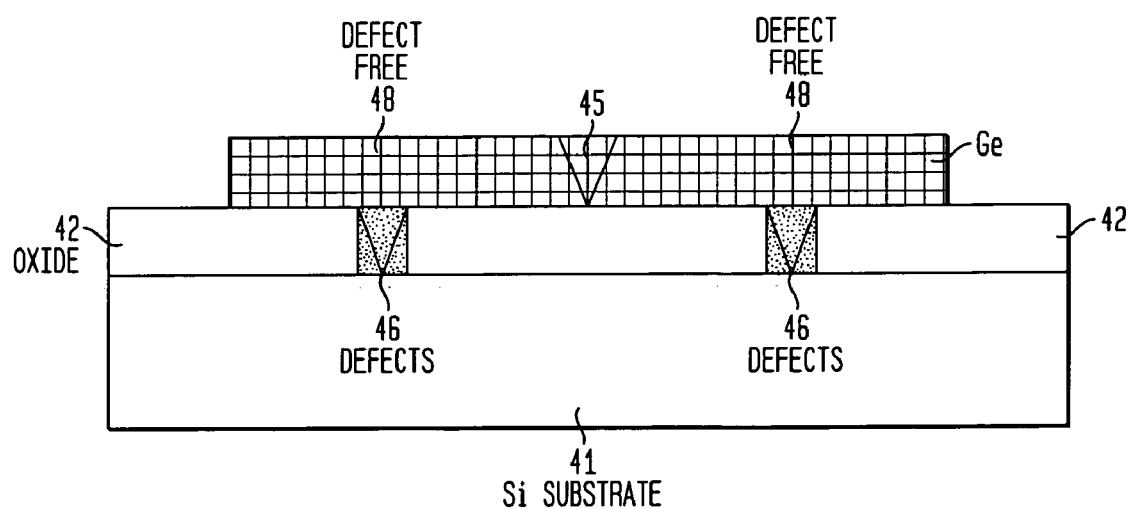

This process was improved by setting the aspect ratio (height/width) of the seed window to more than 1:1 as shown in FIG. 4d [See, T. Langdo et al, *Appl. Phys. Lett.*, Vol. 76, No. 25, p. 3700 (2000), which is incorporated herein by reference.]. In this case no threading misfit dislocations or stacking faults emerged above the seed windows and into the film above them; instead the defects 46 were confined to the region of the seed windows below the top of the oxide layer 42. However, large defect densities were still found in the regions 45 (FIG. 4d) where the growth fronts from different seed windows met. It should be noted that if the distance between seed windows is increased, then a larger fraction of the Ge film area would be defect free. However, this would mean very long growth times and thick films (film thickness grows as the lateral overgrowth distance increases). Thick films also result in long transit times.

One aspect of our invention uses modified ELO to form high quality high Ge content $Si_{1-x}Ge_x$ regions to serve as PD elements in which defect-induced dark currents are suppressed and carrier transit times are limited through the reduction of carrier absorption in highly doped regions. More specifically, this aspect of our invention is a method for forming high-Ge-content $Si_{1-x}Ge_x$ regions (hereinafter referred to as pixels) within an insulating cladding region disposed on a Si substrate such that the volume of possible defective $Si_{1-x}Ge_x$ is minimized and such that the $Si_{1-x}Ge_x$ pixels are essentially defect free. In particular, our invention uses ELO of $Si_{1-x}Ge_x$ to form the pixels above the top of insulator layer 42 in FIG. 4d so that essentially all defects are confined to regions of the seed window below the top of insulator layer 42.

Contrary to the situation in the prior art, in our method no defects are formed at the intersection of the growth fronts. The growth fronts on the overgrown cladding region are confined by the cladding (e.g., silicon dioxide) sidewalls, and, therefore, do not coalesce to form heavily defective regions. This important result is achieved by combining high-Ge-content $Si_{1-x}Ge_x$ ELO with damascene planarization (ELO-D). In general, Damascene involves the steps of forming a window in an insulating layer on a wafer, filling the window with a material that is different from the wafer (e.g., a semiconductor or a metal) and that overlaps the top surface of the insulating layer, and then planarizing (e.g., chemical-mechanical polishing) the overlapping portions so that the material in the window is essentially flush with the top surface of the insulating layer.

In our process high-Ge content $Si_{1-x}Ge_x$ means $Si_{1-x}Ge_x$ with a Ge concentration or mole fraction x that is preferably greater than about 0.8-0.9 for most applications of PDs at IR operating wavelengths of about 800-1600 nm. In some applications, however, x may be as low as 0.5, but $Si_{1-x}Ge_x$ having a Ge content less than about 50% does not offer sufficient optical absorption in the wavelengths of interest. On the other hand, in other non-optical devices it may be acceptable to have x as low as 0.1.

One set of processes steps utilized to achieve this goal for a surface-illuminated PD will now be explained in conjunction with FIGS. 5a-5g.

Figure 5A:
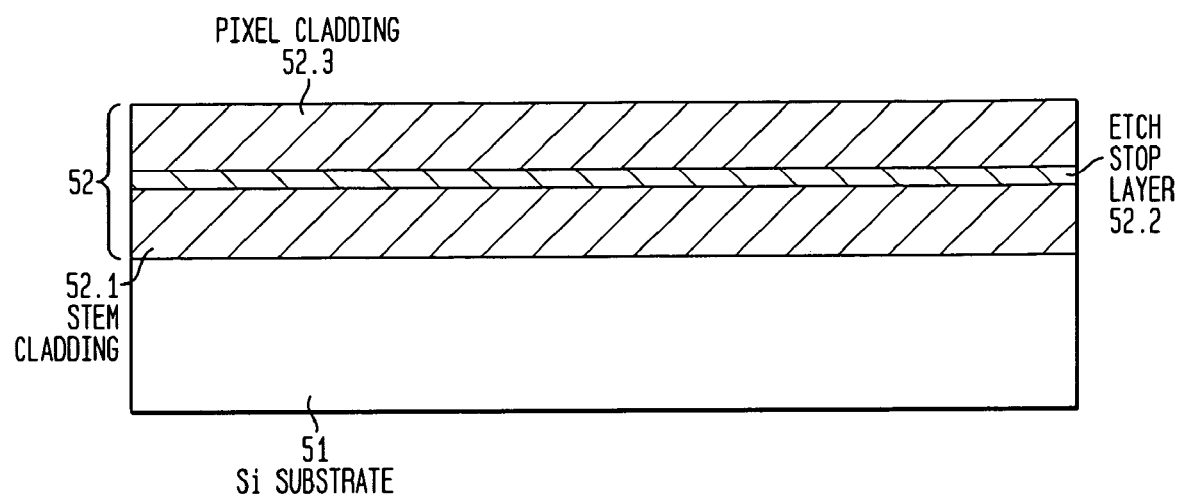
FIGS. 5a-5f are schematic, cross sectional views used to describe the salient process steps of an illustrative embodiment of our invention.
Figure 5B:
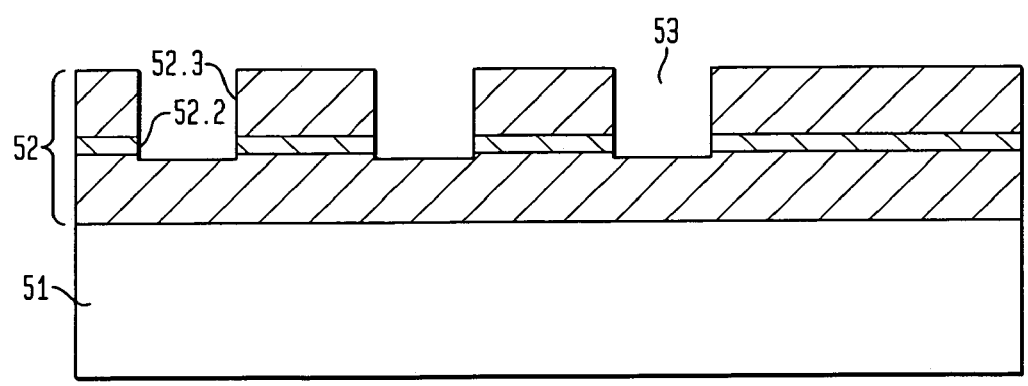

First, an insulating cladding region 52 is formed on the top surface of a Si substrate 51, as shown in FIG. 5a. Illustratively cladding region 52 comprises a multiplicity of insulator layers (hereinafter referred to as cladding layers) formed on the substrate. First a stem cladding layer 52.1 [e.g., 1 μm of a silicon dioxide] is deposited on the top major surface of the substrate 51. Next, an etch stop layer 52.2 (e.g., 40 nm of silicon nitride) is deposited on cladding layer 52. Finally, a pixel cladding layer 52.3 (e.g., 1 μm of silicon dioxide) is deposited on the etch stop layer. Cladding layers 52.1 and 52.3 may each comprise a multiplicity of layers or they may be single layers; they may have different thicknesses; and they may have different compositions from one another. The cladding layers may alternatively comprise other dielectric materials such as silicon nitride or silicon oxynitride.

In one embodiment, the etch stop layer 52.2 and the pixel cladding layer 52.3 have different compositions, and the etch rate of etch stop layer 52.2 should be smaller than that of pixel cladding layer 52.3. In an alternative embodiment, even if the etch rate of layer 52.2 is not substantially different from that of layer 52.3, well known optical metrology techniques can be used to discern the extent of the etching process and to stop etching at the appropriate time based on the difference in chemical composition of the etched layers.

Next (FIG. 5b), $Si_{1-x}Ge_x$ active region (pixel) wells 53 are defined lithographically on pixel cladding layer 52.3, and a standard etch chemistry (e.g., a mixture of $CHF_3$, $C_2F_6$, CO and Ar) is used to selectively etch the material of pixel cladding layer 52.3. Etching essentially stops at the material of the etch-stop layer 52.2. Next, we switch to a different chemistry (e.g., hot phosphoric acid for 60 sec) to etch the etch-stop layer 52.2, ending on stem cladding layer 52.1.

Figure 5C:
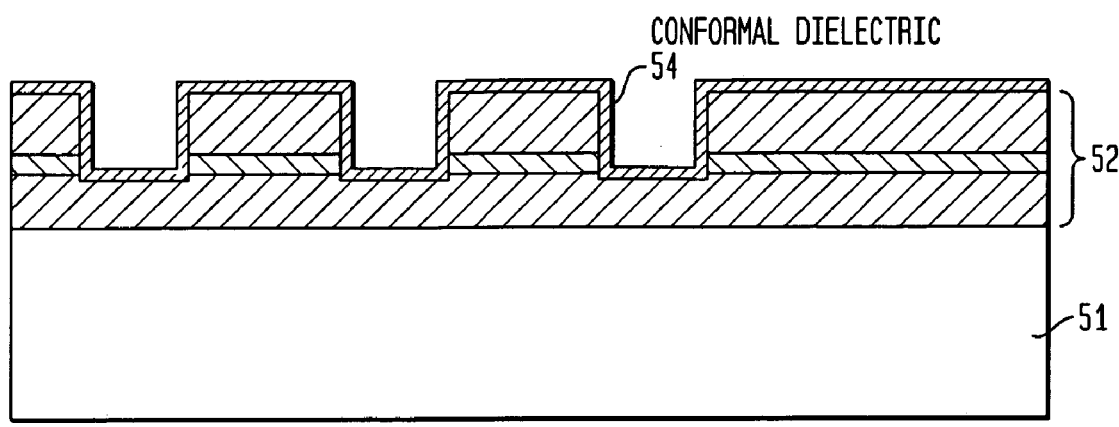

As illustrated in FIG. 5c, we then deposit a conformal dielectric layer 54 (e.g., 200 nm of plasma TEOS oxide) over the structure to cover the pixel cladding layer 52.3, etch stop layer 52.2, and the exposed surface of the stem cladding layer 52.1. The conformal dielectric layer 54 should be able to resist nucleation of $Si_{1-x}Ge_x$ material on its surface during the subsequent selective epitaxial growth (SEG) procedure.

Figures 1, 5D:
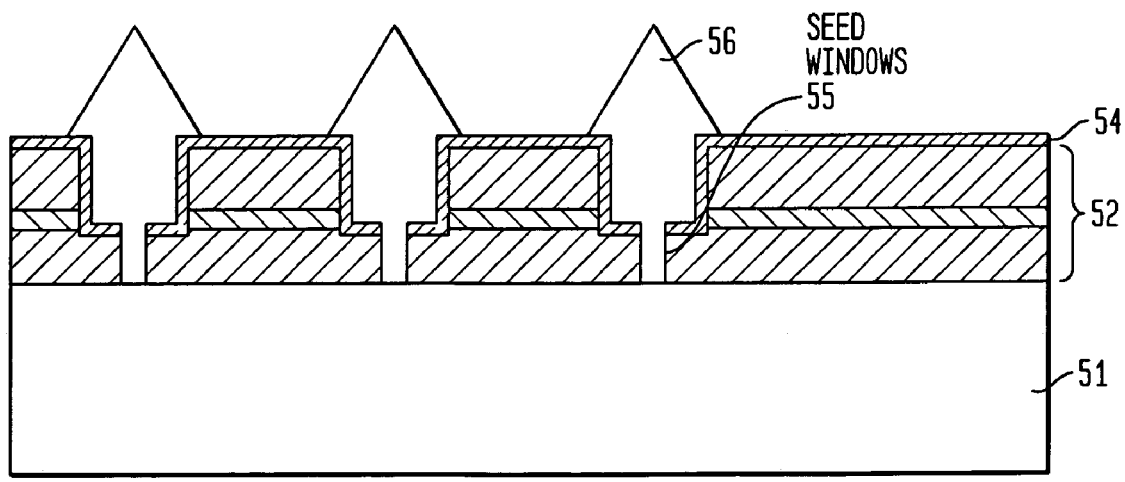

A second lithography step defines a smaller seed (stem) window 55 inside the active region window 53, as shown in FIG. 5d-1.

The conformal dielectric layer 54 and stem cladding layer 52.1 are then etched selectively down to the Si substrate 51, also as shown in FIG. 5d-1. This second lithography and etch step forms the seed windows 55 for ELO growth. Using ELO, the seed window and active region wells are filled with epitaxial $Si_{1-x}Ge_x$.

Figure 6A:
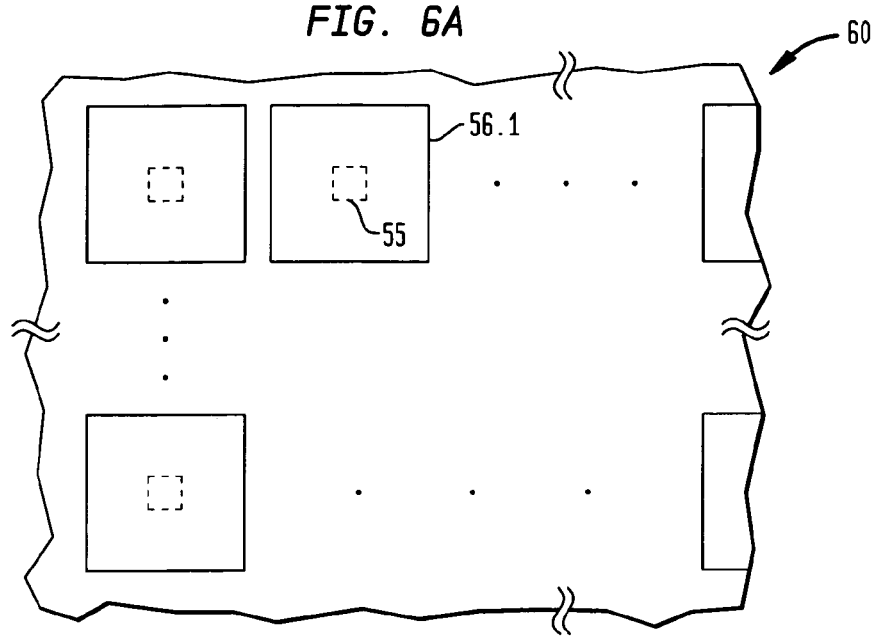
FIG. 6a is a schematic, top view of an array of devices in accordance with one embodiment of our invention.

The shape of the pixels (in top view, as shown in FIG. 6a) is preferably symmetric (e.g., square, rectangular or circular;) since the overgrowth process (discussed below) proceeds uniformly outward from the seed window. Similar shapes may be used for the stem region. However, since it is difficult to tile a surface with circles, the use of a circular cross-section for the pixels, and hence the stem regions, is not preferred.

Figures 2, 5D:
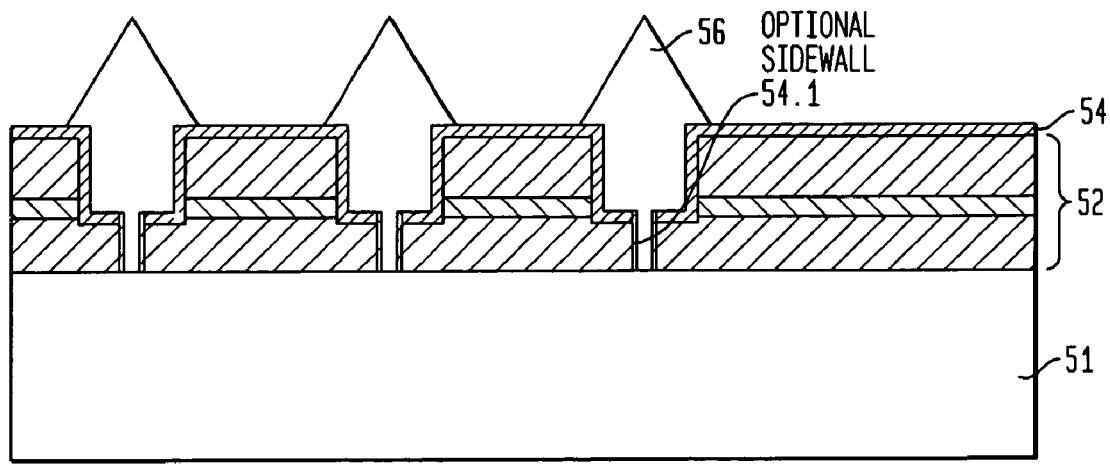

Due to the inherent facet formation during growth, the structure must be overgrown by some amount to ensure complete filling of the well region. (When the active region windows have square cross-sections, the overgrowth tends to have a pyramidal shape, as shown at 56 of FIG. 5*d*). The degree of the faceting of the epitaxial layer is strongly determined by the growth conditions that are in turn strongly influenced by the dielectric material surface exposed during SEG. In this case the exposed dielectrics are conformal dielectric layer 54 and stem cladding layer 52.1. If the dielectric material of layer 54 is superior (in terms of rejecting nucleation of $Si_{1-x}Ge_x$ during SEG) to other dielectrics used in the cladding structure 52, further optimization of the growth process can be accomplished by using an additional deposition of a conformal dielectric layer material followed by an anisotropic etch after formation of the seed windows, leaving a conformal dielectric layer 54.1 on the sidewalls of the stem window but not on the bottom thereof, as shown in FIG. 5*d*-2. After the anisotropic etch, the exposed dielectric would be only layer 54/54.1 material, and the growth conditions could be optimized independent of the original materials of cladding layer 52. This embodiment of our invention is important since in a given CMOS process, the materials used for the interlevel dielectrics (ILDs) may allow $Si_{1-x}Ge_x$ to nucleate on the ILD during the epitaxial growth step.

Since the misfit dislocations arising from strained $Si_{1-x}Ge_x$ growth on Si are primarily of the 60-degree type, it is desirable that the aspect ratio of the seed window be larger than about 1.7 (in both cross-sections perpendicular to the plane of the layers) to limit defect penetration above the top of stem cladding layer 52. Since the Ge mole fraction x is at or near 1 (e.g., x~0.8-0.9) for the PD pixel, this aspect ratio is especially important to attaining defect-free material in the detector well. Other aspect ratios would apply to other materials systems (e.g., GaN grown on Si) and can readily be determined by those skilled in the art.

Figure 5E:
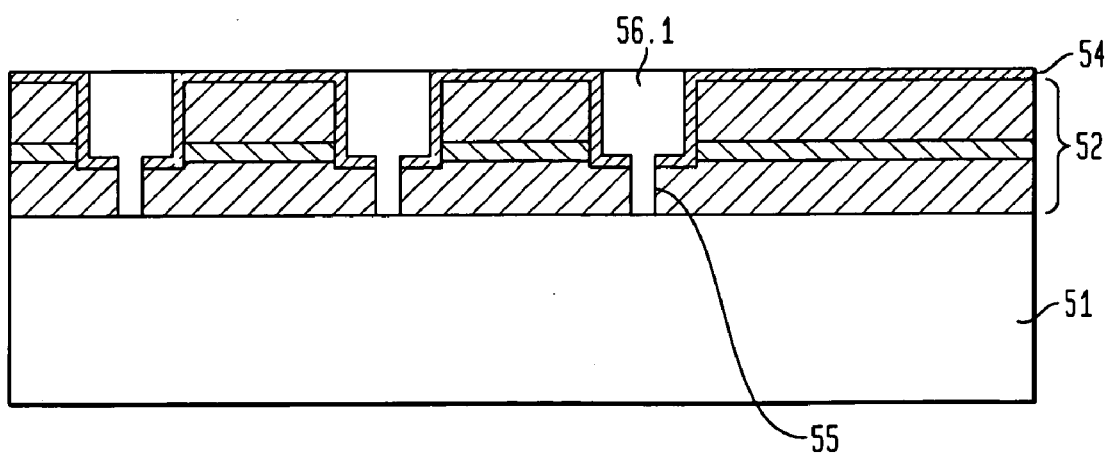

FIG. 5*e* displays the structure after damascene planarization of the overgrown material 56, as shown in FIG. 5*d*, using a technique such as chemical-mechanical polishing (CMP). One result is that the top of the active region 56.1 is essentially flush with the top of cladding region 52, which in this embodiment includes conformal layer 54. In this regard, the composition of layer 54 should make a good CMP stop for $Si_{1-x}Ge_x$ polishing.

At this point we define several volume parameters: the volume of an active region or pixel 56.1 is the volume of the epitaxial material that is grown in the first opening (after the conformal dielectric is deposited), and the volume of a stem region is the volume of the epitaxial material that is grown in the second opening with no conformal dielectric deposited therein (FIG. 5*d*-1) or with a conformal dielectric so deposited (FIG. 5*d*-2), depending on the design chosen or fabrication process used.

Figure 5F:
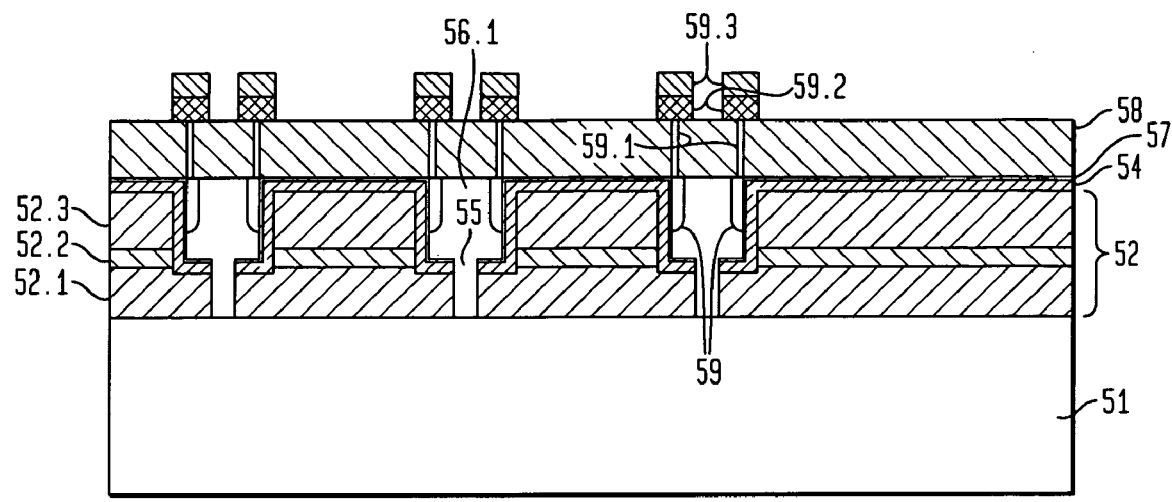

The process continues with a sequence of conventional steps that converts the basic structure of FIG. 5*e* into an array of pixel regions 56.1 that function as surface-illuminated PDs, as shown in FIG. 5*f*. For example, an implant screen oxide layer 57 (e.g., 80 nm of plasma TEOS) is deposited over the entire structure, and ion implantation is used to form the opposite-conductivity-type (p-type and n-type) contacting regions 59. For example, each of the implants could involve a sequence of three separate implants at the following energies/doses: for n-type regions—P at 60 KeV/$1\times10^{15}$ cm$^{-2}$, 170 KeV/$2\times10^{15}$ cm$^{-2}$, and 320 KeV/$4\times10^{14}$ cm$^{-2}$; and for p-type regions—B at 20 KeV/$1\times10^{15}$ cm$^{-2}$, 60 KeV/$2\times10^{15}$ cm$^{-2}$, and 140 KeV/$4\times10^{15}$ cm$^{-2}$. A furnace anneal (e.g., at 400° C. for 30) minutes or a rapid thermal anneal (e.g., at 600-650° C. for 20-30 sec) removes implant damage to the crystalline lattice and simultaneously activates the implanted dopants. The active region itself is preferably i-type; that is undoped or unintentionally doped. (Unintentionally doped means that any doping present in the active region is a very low levels and occurs primarily from background contamination in the epitaxial growth chamber use to form that region.)

Lastly, an interlevel dielectric (ILD) layer 58 is deposited over the structure, contact windows are pattered and etched using an etch chemistry that does not selectively etch germanium (e.g. a mixture of $CH_4$, $CH_3$ and Argon), contact metal is deposited and a patterned hard dielectric 59.3 is used to shape electrodes 59.2 (e.g., Ti/TiN/Al) on the top surface and plugs 59.1 (e.g., Al) that connect the electrodes to the p-type and n-type regions 59.

Figure 5G:
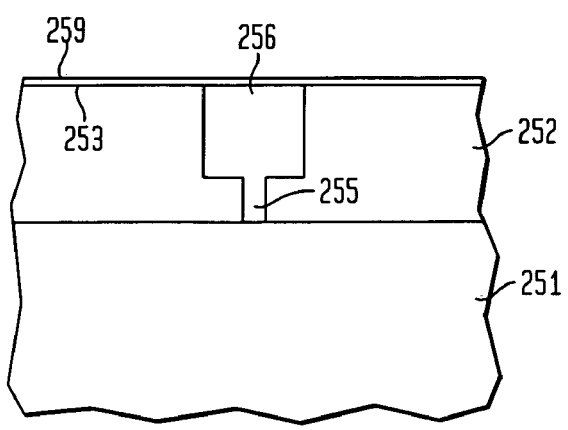
FIG. 5g is a schematic, cross sectional view of a semiconductor device in accordance with an illustrative embodiment of our invention.
Figure 6B:
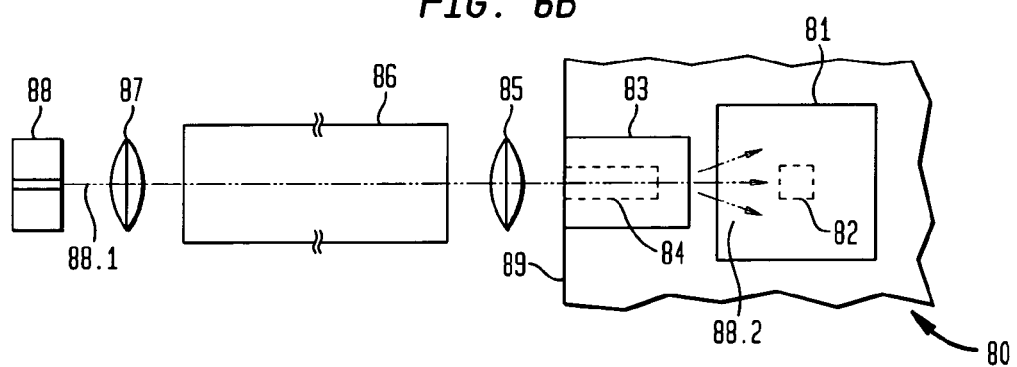
FIG. 6b is a schematic, cross sectional view of an edge-illuminated PD coupled to an integrated waveguide (WG) as part of an optical subsystem in accordance with yet another embodiment of our invention.

Although the foregoing process describes the fabrication of surface-illuminated PDs, the basic process steps that result in a structure of the type shown in FIG. 5*e* or 5*g* can also be utilized to fabricate other devices such as semiconductor waveguides (WGs) that deliver signal light to edge-illuminated PDs. More specifically, a WG can be formed in the same fashion as the active region or pixel 56.1 of FIG. 5*e*, but the WG and the active region would be juxtaposed as shown in FIGS. 6*b* and 7*b* so that signal light coupled into, for example, a cleaved end 89 (FIG. 6*b*) of the WG; e.g., from optical fiber 86, FIG. 6*b* is delivered to an adjacent pixel (e.g., 81, FIG. 6*b*).

The fabrication process should take care that the WG is aligned with the pixel both laterally and vertically in order to feed signal light into the active region of the pixel; little or none of the optical signal should be fed into the stem region of the PD.

In addition, the WG material should have a lower Ge content than the pixel so that the pixel will absorb light in the required wavelength band but that the WG will not.

Because the WG structure is elongated along its axis of light propagation, it is not possible to make the aspect ratio of the WG seed window (in the cross-section taken along that and perpendicular to the plane of the layers) larger than the 1.7 factor required to suppress defect formation for large Ge content. Fortunately, defects in the WG are not as important as defects in the pixel, since the WG is not electrically active. However, defects in the WG do lead to optical losses through scattering. Therefore, in devices that require low-loss waveguides, the Ge content in the WG should be limited to ensure low defect density. Typically, 20% Ge content is low enough to limit significant defect formation.

Figure 6C:
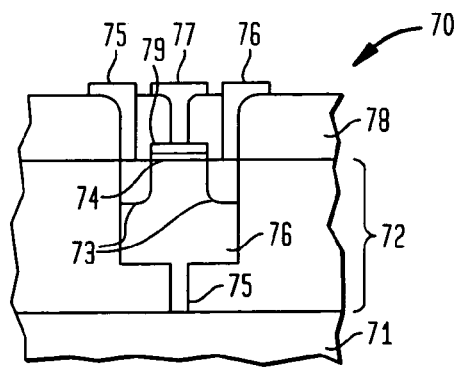
FIG. 6c is a schematic, cross sectional view of a MOSFET in accordance with another embodiment of our invention.

In a similar fashion, the basic process steps that result in a structure of the type shown in FIG. 5*e* or 5*g* can also be utilized to fabricate a SiGe on Si or GaN on Si MOSFET of the type shown in FIG. 6*c*. In this case, the active region 56.1 (FIG. 5*e*) would serve as the site for formation of the source, drain and gate regions of the transistor using standard process steps well-known to those skilled in the art.

Basic Device Structure

Illustratively, semiconductor devices in accordance with various embodiments of our invention may be designed to function as a number of different devices; e.g., surface-illuminated PD (e.g., FIGS. 5f and 6a), an edge-illuminated PD with an integrated WG (e.g., FIG. 6b), or a MOSFET (e.g., FIG. 6c).

In accordance with one aspect of our invention, the basic structure of such a semiconductor device includes a single crystal substrate 251 comprising a first material (e.g., Si) and an insulative cladding region 252 comprising a dielectric material (e.g., $SiO_2$). Embedded in the cladding region is a pair of single crystal regions: stem region 255 and active region 256 (e.g., the absorption region of a PD; the source, drain and channel regions of a MOSFET) each comprising a second, different semiconductor material (e.g., GaN or $Si_{1-x}Ge_x$, $0<x\leq1$; hereinafter referred to as SiGe for simplicity). Stem region 255 connects the substrate to the active region, which is essentially flush with the top surface 253. Importantly, the stem region is designed so that defects are confined thereto; that is, active region 256 is essentially defect-free. Stated another way, active region 257 has an extremely low density of defects (i.e., less than about $10^3$ $cm^{-3}$) so that any defects that might be present have an insignificant effect on device performance. To this end, the aspect ratios of the stem region (i.e., the ratio of its depth to both of its width dimensions in the case of a square or rectangular cross-section in a plane parallel to the layers) is designed to provide the desired confinement of defects. For example, where the substrate is Si and the pixel and stem regions are SiGe, the aspect ratios of the stem region should be larger than about 1.7.

In theory the cladding region 52 may be a single layer, but in practice it is preferably multi-layered including, for example, a stop etch layer 52.2 disposed between a lower dielectric layer 52.1 and an upper dielectric layer 52.3. The latter are typically oxides but need not be the same material nor need they have the same thickness. In the case where the substrate 51 is Si and the pixel is SiGe, the stop etch layer 52.2 is illustratively $Si_3N_4$ and the upper and lower dielectric layers 52.1 and 52.3 are illustratively silicon dioxide. These cladding region materials may also be used to fabricate devices in which the substrate is Si and the pixel and stem regions are GaN.

Surface-Illuminated Photodetectors (PDs)

This basic device structure is designed, as shown in the top view of FIG. 6a, to function as a surface-illuminated PIN PD or as an array 60 of such PDs. Each PD includes a single crystal stem region 55 (FIG. 5f), which comprises a first material and is designed to confine defects thereto. Stem region 55 epitaxially connects the single crystal substrate 51, which comprises a different material, to the pixel 56.1. As described in the preceding fabrication section, the stem region serves to allow nucleation at the exposed substrate surface during epitaxial growth of regions 55 and 56.1. Each PD also includes an essentially defect-free i-type, single crystal active region (or pixel) 56.1 of the same material in which signal light is absorbed. As depicted in FIG. 5f, the top of each pixel 56.1 is essentially flush with the top of the dielectric cladding region 52, which in this embodiment includes conformal dielectric layer 54.

The PIN design is completed by opposite-conductivity-type (one p-type; the other n-type) contact regions 59 formed in the pixel 56.1. An interlevel dielectric (ILD) region 58 is disposed over the top surface of the cladding region and pixels. Electrical contact is made to the contact regions 59 by means of conductive (e.g., metallic) plugs 59.1 that extend from electrodes 59.2, 59.3 through the ILD 58. This PD design, when fabricated using low-defect-density $Si_{1-x}Ge_x$ pixels with x~0.8-0.9 on a Si substrate, is particularly well-suited to relatively high speed (e.g., $\geq2.5$ Gb/s) communications applications at operating wavelengths in the 800-1600 nm range. However, our invention is not limited to applications in which the Ge content is this high. In fact, our invention may be advantageous with active regions or pixels having considerably less Ge: e.g., $x\geq0.1$, depending on the wavelength of operation (in the case of PDs) or on the device function (in the case of MOSFETs or other electronic devices). For example, our low-defect-density pixels would be useful in PD applications such as those involving an IR or visible wavelength camera or IR wireless local area networks (WLAN), which would benefit from a higher optical absorption of our pixels than is available using prior art Si pixels.

In surface-illuminated PDs, the formation of dielectric mirrors at either the top or bottom surfaces (or both) of each pixel 56.1 (FIG. 5f) enhances performance.

A mirror at the bottom of each pixel increases the QY of the device by reflecting back into the pixels any un-absorbed light that reaches the bottom of the pixels. The bottom mirror increases the apparent optical path length without requiring a thicker pixel. In one embodiment, the portions of the cladding region 52 (FIG. 5f), 252 (FIG. 5g) adjacent the stem region comprise an alternating set of layers that have different indices of refraction. The mirror layer thicknesses are chosen to produce the desired reflectance (at the operating wavelength) between the bottom of the pixel and the cladding region 52.1 (FIG. 5f), 252 (FIG. 5g).

In an alternative embodiment, a dielectric mirror 259 (FIG. 5g) is also formed on the top surface of each pixel 56.1 (FIG. 5f), 256 (FIG. 5g). A resonant cavity is formed within the pixel by designing the dielectric mirrors to have the proper reflectance on both the top surface and the bottom surface of the pixel.

To reduce reflections from the pixel-ILD interface, an anti-reflection (AR) coating may be inserted between the pixel 56.1 and the ILD 58. Those skilled in the art are familiar with various techniques for forming such AR coatings.

Figure 7A:
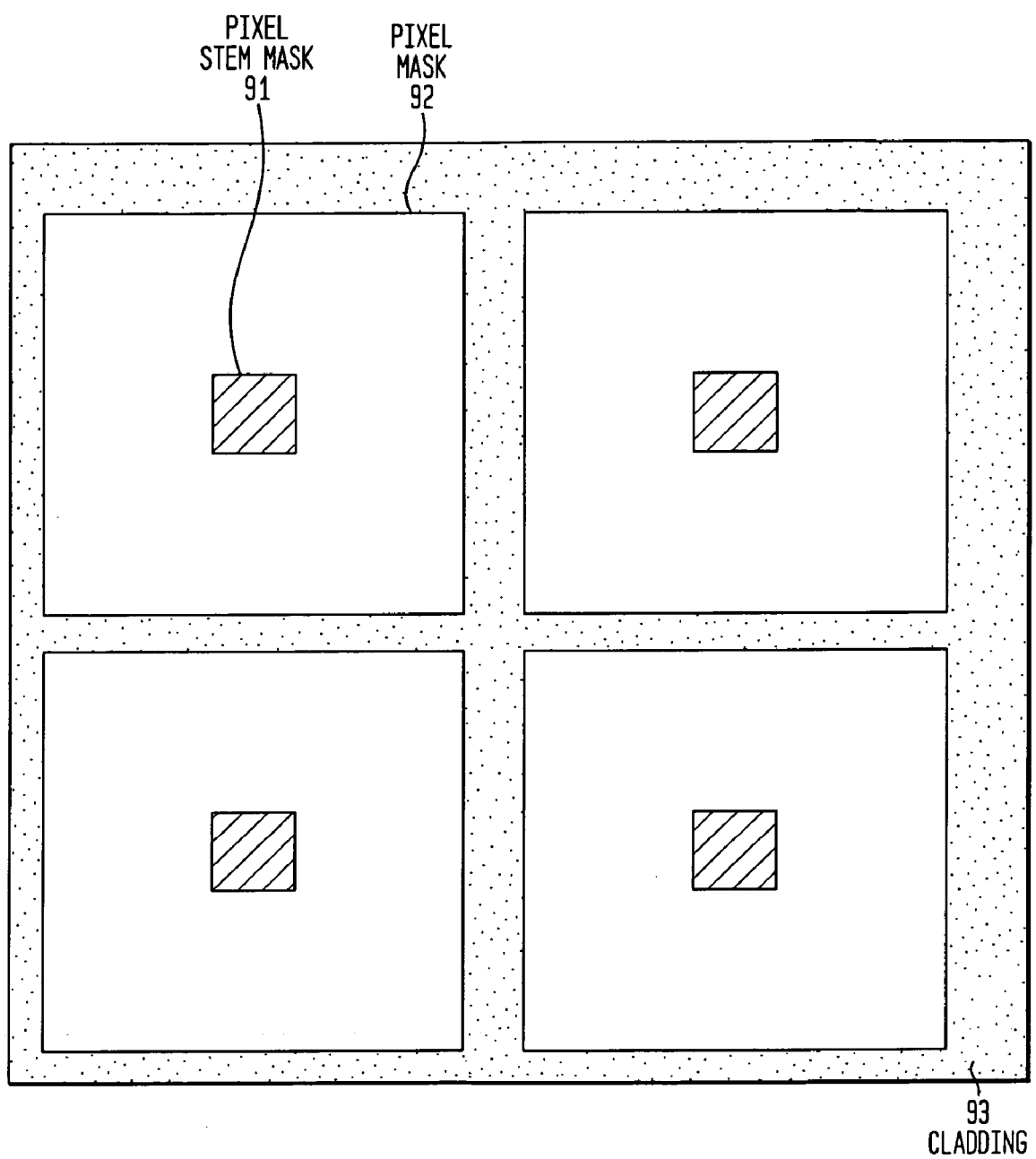
Figure 7B:
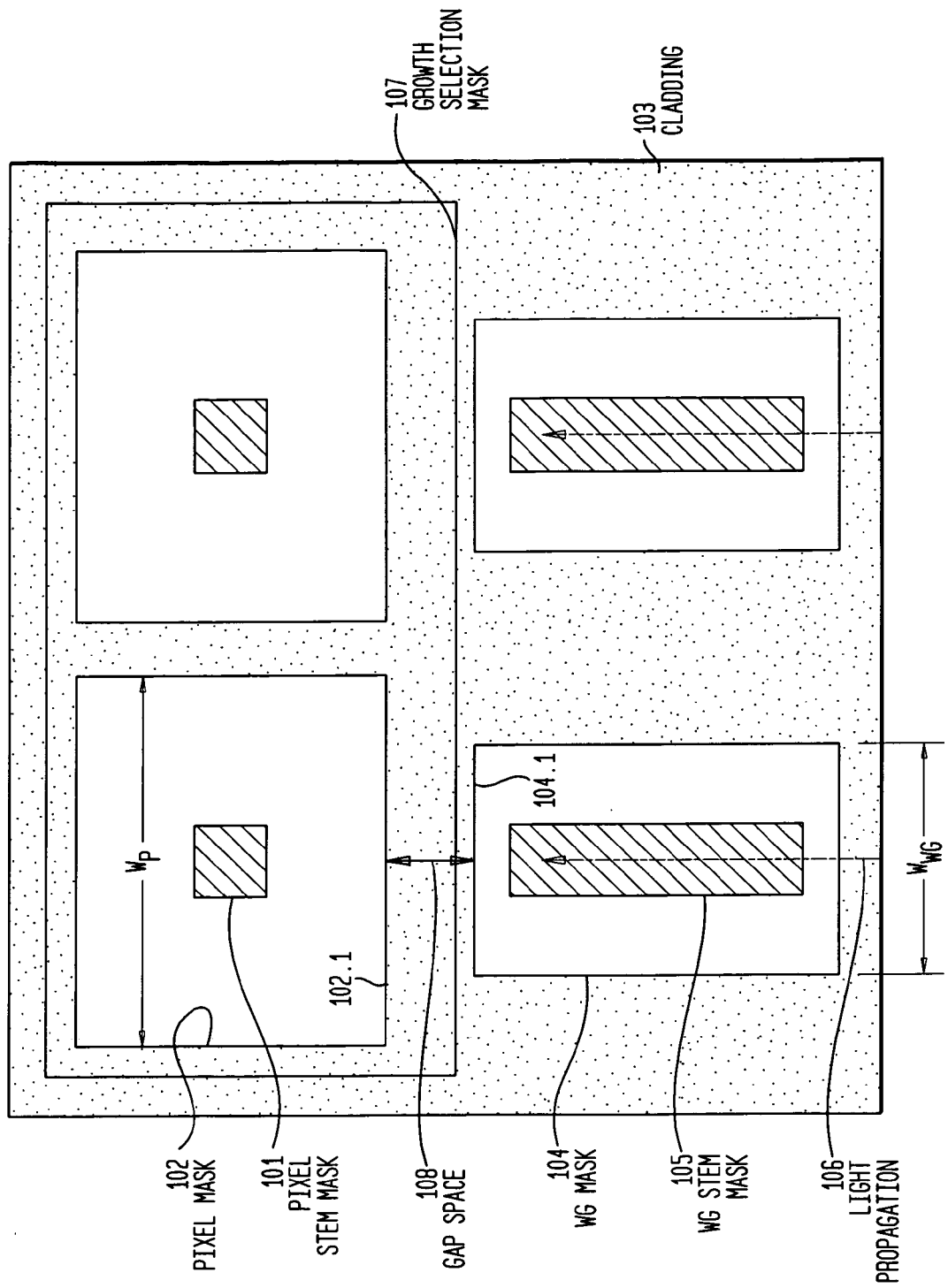
FIG. 7b is a schematic, top view of a set of masks used to fabricate an edge-illuminated PD and integrated WG of the type depicted in FIG. 6b.

In accordance with another aspect of our invention, FIG. 7a shows a plan-view of the two relevant lithography levels used to generate pixels in a surface-illuminated PD. The pixels, which illustratively have the three dimensional shape of cylinders, are depicted as having square cross-sections, but, of course, it would be readily apparent to those skilled in the art that other geometric cross-sections could be utilized; e.g., rectangles or circles, as previously discussed. Moreover, an array of four pixels is shown for purposes of illustration only. It is understood by those skilled in the art that a surface illuminated PD would typically be tiled by a larger set of pixels; on the other hand, it is also possible that the entire area could comprise one large pixel. The latter design, however, would require very long growth times for typical optical spot sizes (e.g., 15 μm by 15 μm). The top surface area of the pixel is defined by the pixel mask 92 and the corresponding area of the stem region is defined by the pixel stem mask 91. The area of the stem mask should lie entirely inside of the area of the pixel mask. The area between the pixels comprises an exposed portion of cladding region 93 (also shown as the conformal dielectric layer 54 in FIG. 5f).

In addition, the ratio of the area outside the pixel, which corresponds to the exposed area of cladding region 93, to the area of the pixels themselves 92 should be minimized to ensure that the maximum amount of signal light is captured in a surface-illuminated device. Ideally, the area of the stem region is much smaller than the area of the pixels, and the area between the pixels is small compared to the area of the pixels themselves. This design ensures that more of the light is incident upon the pixels (hence higher QY) and that little light can find its way into the stems where there are defects and from which the transit times for escape are long. As noted earlier, it is desirable that the height of the stem region be larger than or equal to width of either side of the stem region (preferably >1.7 times larger for SiGe stem regions grown on a Si substrate) in order to limit the formation of defects to the stem region and to keep them from penetrating into the pixel. In one embodiment, the height of the stem is given by the thickness of the deposited stem cladding layer 52.1 plus the thickness of conformal dielectric layer 54 of FIG. 5*f*.

Edge-Illuminated PDs

In accordance with another embodiment of our invention, the PDs are edge-illuminated rather than surface-illuminated. In this case, as shown in FIG. 6*b*, signal light to be detected is delivered to a pixel 81 by means of a semiconductor waveguide 83. The pixel 81 and the waveguide 83 have stem regions 82 and 84, respectively, which are fabricated using similar procedures but different masks. In addition, whereas the cross-section of the pixel stem region 82 is depicted as being square, that of the waveguide is shown as being rectangular, again for the purposes of illustration only (although the elongated shape of waveguide 83, terminated at its exterior end by, for example, a cleaved surface 89, does lead to a design in which the waveguide and its stem region are both rectangular).

Typically, the pixel and waveguide are incorporated in a subsystem 80 that includes a semiconductor laser 88 (e.g., an InP/InGaAsP laser) for generating an output signal 88.1 at a center frequency in the range of about 800-1600 nm. In communications applications, the latter is modulated either directly (by an external modulator, not shown) or indirectly (by modulating the drive current applied to the laser using circuitry, not shown). The signal light is coupled into an optical fiber 86 be means of a suitable first lens system 87 (or the laser 88 and fiber 86 may be butt-coupled to one another), and output of the fiber is coupled into the waveguide 83 (preferably not into the stem region) by means of a suitable second lens system 85 (or the fiber 86 and the waveguide 83 may be butt-coupled to one another). The waveguide 83 delivers the modulated signal light 88.2 to the pixel 81 (preferably not to the stem region 82). Signal light absorbed in the pixel is converted to a photocurrent, which flows to detection circuitry (not shown).

In accordance with another aspect of our invention, FIG. 7*b* shows a plan-view of the relevant lithography levels used to generate a pixel and WG in an edge-illuminated PD. The direction of light propagation in this structure is designated by arrow 106. The pixels are formed with a pixel mask 102 and a stem region mask 101, similar to the approach used to fabricate the surface-illuminated PD of FIG. 7*a*. The WGs are formed in the same cladding region 103 as the pixels.

The length of the gap space 108 between the edge 102.1 of the pixel mask 102 and the edge 104.1 of the WG mask 104 is preferably optimized to reduce scattering losses from the discontinuity in refractive index imposed by the cladding region 103 in the gap between the pixel and the WG. The maximum amount of light is passed from the WG into the pixel if the length of the gap space is equal to an even multiple of half wavelengths as measured in the material of the cladding region. In this design the gap constitutes a resonant cavity.

Furthermore, the speed of the edge detector of FIG. 7*b* is increased by injecting the signal light from the WG into only a middle portion of the pixel. To this end the width $W_{wg}$ of the WG should be made less than the width $W_p$ of the pixel, and the center of the WG should be aligned with the center of the pixel (and, hence, above its stem region). In this case, photogeneration of carriers primarily occurs in the middle of the pixel, and, therefore, the maximum carrier transit time to the edges is reduced compared to the case in which the pixel is uniformly illuminated. This design of the WG and pixel sections also increases QY since the pixel is able to capture more of the light that diffracts from the end of the WG aperture.

MOSFETs

In accordance with another embodiment of our invention, as shown in FIG. 6*c*, a MOSFET comprises a single crystal substrate 71, a stem region 75 formed on the substrate so as confine defects to the stem region, a relatively defect-free active region 76 formed on the stem region. The stem and active regions are embedded in a dielectric cladding region 72, and the top of the active region is essentially flush with the top of the cladding region. Separated source and drain regions are formed in the active region (e.g., by ion implantation) and a gate structure is formed between them. The gate structure includes a gate dielectric (e.g., a high-k dielectric such as $HfO_2$ or $Al_2O_3$ grown by ALD) and a well-known gate stack (e.g., including one or more polysilicon layers). The channel (not shown) extends under the gate dielectric 74 and between the source and drain regions 73. An ILD 78 is formed over the top of the cladding and active regions, and windows are formed therein to allow source, drain and gate electrodes (75, 76, 77, respectively) to make electrical contact to the corresponding source and drain regions and gate structure.

Preferably the active region 76 comprises relatively defect-free $Si_{1-x}Ge_x$ on a Si substrate by the fabrication technique previously described. Since Ge, and high-Ge-content SiGe, has higher electron and hole mobility than Si, our MOSFETs can attain higher performance than prior art Si MOSFETs. However, Ge MOSFET integration must address the same issues as the integrated high-Ge-content SiGe PDs: that is, the lattice constant mismatch between Si and Ge in the prior art leads to relatively high defect densities in bulk grown Ge films, and the thick process stacks and high anneal temperatures used by the prior art to grow Ge with reasonable defect densities are incompatible with conventional Si processing. Accordingly, it is another aspect of our invention that MOSFET structures are formed in the high-Ge-content SiGe active regions by means of our ELO-D process.

Our approach not only allows easy integration of high quality Ge MOSFETs into Si integrated circuits, but also enables the realization of SOI (silicon-on-insulator) Ge MOSFETs, which provide better performance than convention bulk MOSFETs though parasitic capacitance and better short channel control.

It will be appreciated by those skilled in the art that the pixel cladding layer thickness (for a given channel doping level) determines whether these devices are either partially or fully depleted.

PD Contact Configurations: Speed of Operation

Another aspect of our invention relates to PD contact configurations that ensure that transit times are limited by short drift times, not by long diffusion times ($\tau_{diff}$). These designs, which are illustrated in FIGS. 8 and 9, enhance the speed of operation of the PD and hence are particularly well suited for operation in high-speed (e.g., >2.5 Gb/s) communications systems.

To this end, and in accordance with another embodiment of our invention shown in FIG. 8a, we utilize an MSM type contact structure that is free from $\tau_{diff}$ limitations, but the pixels are formed using our ELO-D technique previously described. In particular, voltages of opposite polarities ($V^+$ and $V^-$) are applied to alternating metal contacts 117 to each pixel 115. Within a given pixel, no two adjacent metal contacts have the same polarity. This design ensures that there are always high fields that accelerate the generated photocarriers so that the drift transit time is minimized. Illustratively, the contacts 117 are made of metals (e.g., Ag) that form Schottky barriers on SiGe.

The device of FIG. 8a may be used as a surface-illuminated PD or edge-illuminated device. When used as a surface-illuminated PD, the contact 117.1 is positioned to fully cover the underlying stem region 116.1 in each pixel, so that signal light incident on the top surface is blocked from penetrating into the stem region. On the other hand, when used as an edge-illuminated device, it is important that the width of the stem region (as measured transverse to the direction of light propagation) be less than half the wavelength of the light in the material (e.g., SiGe) of that region so as to cutoff penetration of light therein.

However, it may not be practical to use a true MSM contacting structure in combination with conventional Si-CMOS processing. Schottky barrier contacts are not part of conventional Si IC processing and could result in contamination of the CMOS devices. In addition, good low leakage contacts are difficult to form, and Schottky barrier metals typical have low melting points, which are incompatible with the temperatures typically used in standard IC metalization schemes.

Therefore, another embodiment of our invention is a MSM-like contacting scheme, as shown in FIG. 8b, that doesn't suffer from the disadvantages of using Schottky contacts. This approach combines a lateral PIN contact arrangement with our ELO-D process. More specifically, a PIN photodiode is formed laterally on the surface of the detector by implantation of $n^+$-type and $p^+$-type contacting regions 128 and 129, respectively; the i-type pixels 125 are undoped or unintentionally doped (i.e., they have sufficiently low doping that they can be completely depleted). Preferably the pixels are SiGe and are either intrinsic or have low doping (i.e., less than about $10^{17}$ cm$^{-3}$), and the doped contact regions have higher dopant concentrations (e.g., greater than about $10^{18}$ cm$^{-3}$). These doped regions are then contacted by metal plugs 127 that extend through and are embedded in the ILD 131. Metal lines (i.e., electrodes) 130 contact the plugs above the ILD. The plugs, ILD and metal lines are all common elements of Si IC processing. As with the PD of FIG. 8a, in the embodiment of FIG. 8b the metal lines 130 and plugs 127.1 also block signal light incident on the top surface from penetrating into the stem region.

The metal lines 130 are connected to positive (132) and negative (133) power supplies $V^+$ and $V^-$, respectively, from a detection circuit (not shown). This design ensures that the PIN diode is reverse biased from $n^+$-type region 128 to pixel 125 to $p^+$-type region 129.

It is another aspect of our invention that within a given pixel, no two adjacent doped contact regions have the same conductivity type or, as with the embodiment of FIG. 8a, are connected to electrical contacts having the same polarity. In addition, the doped contact regions 128 and 129 should be deep enough (as measured from the top of the cladding region) to ensure low leakage contacts from the plugs 127. Making these contact regions approximately 0.2 μm deep is sufficient in SiGe pixels.

PD Contact Configurations: Dark Current

Figure 9A:
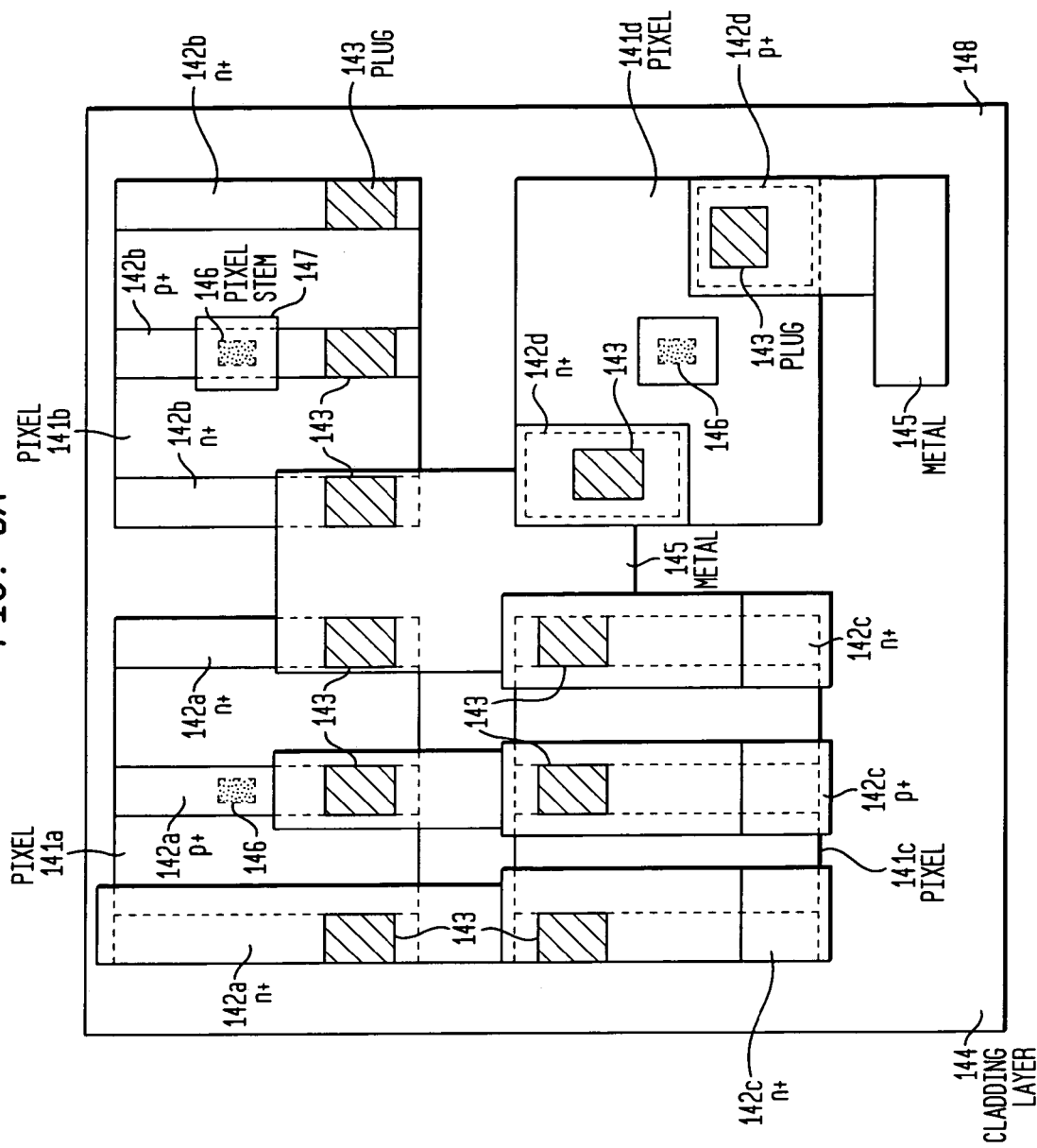
FIG. 9a is a schematic, top view of various mask sets of surface-illuminated PDs illustrating several schemes for enhancing performance in accordance with other embodiments of our invention.

FIG. 9a shows a plan-view of masking features used to realize several possible contacting arrangements for a surface-illuminated pixel array. More than one type of contacting arrangement is depicted on the same PD for purposes of illustration only. In practice, it is likely that only one of these arrangements would be used on a particular PD.

A multiplicity of PD pixels tiles the photo-detecting surface (e.g., the top surface of a front-illuminated PD; the bottom surface of a back-illuminated PD). Four pixels 141a-141d are shown for purposes of illustration only. Each pixel includes doped $n^+$-type and $p^+$-type contacting regions 142. These doped regions are contacted by metal plugs 143, which are electrically connected to metal lines 145 overlying the ILD 148. The pixel stem regions are labeled 146. Because of the long diffusion transit times, it is important to limit the amount of signal light absorbed in the doped contacting regions 142.

In accordance with one embodiment of our invention, diffusion transit times in the doped regions are reduced by means of a light-absorbing (e.g., metal) mask that blocks signal light from reaching (and being absorbed by) part or all of the doped contacting regions. In the prior art care has not been taken to block photogeneration in these highly doped contacting regions because its impact on PD speed has not been appreciated. In fact, prior art devices minimize the amount of metal coverage because it reduces the QY of the PD. However, to achieve higher speed PDs this embodiment of our invention trades a small reduction in QY for a large improvement in speed by limiting light penetration into the doped contacting regions.

More specifically, this embodiment of our invention uses metal over more than about 30% of the aggregate surface area of the doped contact regions to block a significant fraction of signal light from reaching the doped regions. For example, the leftmost $n^+$-type contacting region 142a of pixel 141a is completely occluded from light incident from above the surface, whereas the center $p^+$-type contacting region of pixel 141a is only partly occluded.

Another contacting scheme can be arranged to both ensure that there is no light absorption in the contacting regions while limiting the amount of pixel surface area covered by metal. This arrangement is shown in FIG. 9a, pixel 141d. Here, the doped n+ and p+ contacting regions 142a are arranged in the corners of the pixel. Metal covers the doped contacting regions, but since the contacting regions are in the corners instead of extending from one side of the pixel to the other (in contrast to the other pixels of FIG. 9a) they allow a larger fraction of the surface area of the pixel to absorb light. When using an arrangement such as pixel 141d it is important that the doped contacting regions extend as deep into the pixel as possible in order to ensure that a high electric field exists throughout the volume of the pixel. It apparent to one skilled in the art that it is also possible to place the n+ and p+ contacting regions 142d in other regions of the pixel (as opposed to the corners) as long as high electric fields are maintained throughout the pixel and that these contacting regions are covered with metal.

The speed of the surface-illuminated PD can be increased by directing signal light into only a portion of the middle of the pixel; e.g., the portion that lies between the doped contacting regions, as shown in pixel 141c of FIG. 9a. In this case, photogeneration of carriers occurs only in that portion of the pixel, and, therefore, the maximum carrier transit time to the doped contacting regions is reduced (compared to the case in which the pixel is uniformly illuminated). To this end, at least 30% of the top surface area of the doped contacting regions should be covered by metal. Pixels 141a and 141b illustrate such partial coverage of the contacting regions, whereas pixel 141c depicts complete (100%) coverage, which is preferred. In addition, in each case the width of the metal not only covers the doped contacting regions, but also shadows part (e.g., at least 20%) of the top surface area of the intrinsic absorbing regions of the pixel between them. Obviously, the upper limit for metal coverage of the pixel is not 100% but a lesser amount determined by the trade off between QY (which favors less coverage) and speed (which favors more coverage). Together this criteria define another embodiment of our invention in which metal covers at least 30% of the top surface of the doped contacting regions and more than about 20% of the top surface area of the undoped absorbing regions of the pixel between the doped contacting regions.

It will be readily appreciated by one skilled in the art that this embodiment of our invention of covering the doped contacting regions by metal can improve PD speed in any type of surface-illuminated lateral PIN PD.

Another way to limit the long diffusion transit times for the doped contacting regions, in the absence of the type of metal masking described above, is to limit the volume of the doped regions compared to the volume of the pixels, which in practice means (i) limiting the depth of the implants to around 0.2 µm in SiGe pixels, and (ii) making the width of the doped contact stripes small compared with the width of the pixel. In accordance with another embodiment of our invention, the volume of the doped contacting regions within a particular pixel is less than about 25% of the volume of that pixel.

Another technique for limiting carrier transit times, in accordance with yet another embodiment of our invention, is to use metal to cover the pixel stem region. An example of this arrangement is shown in pixel 141b of FIG. 9a. Here metal 147 completely covers the stem region 146. For a top-illuminated PD, this design eliminates signal light penetration into the stem region so that no carriers are generated therein. Carriers generated in the stem region would have long transit times to the contacts. In addition, with or without metal covering over the pixel stem region, the volume of the stem region should be minimized compared to the volume of the pixel. The pixel stem region is not used for light absorption; it may contain defects that generate dark currents. Therefore, one important feature of this embodiment of our invention is that the volume of the pixel stem region be less than about 25% of the volume of the pixel.

Figure 9B:
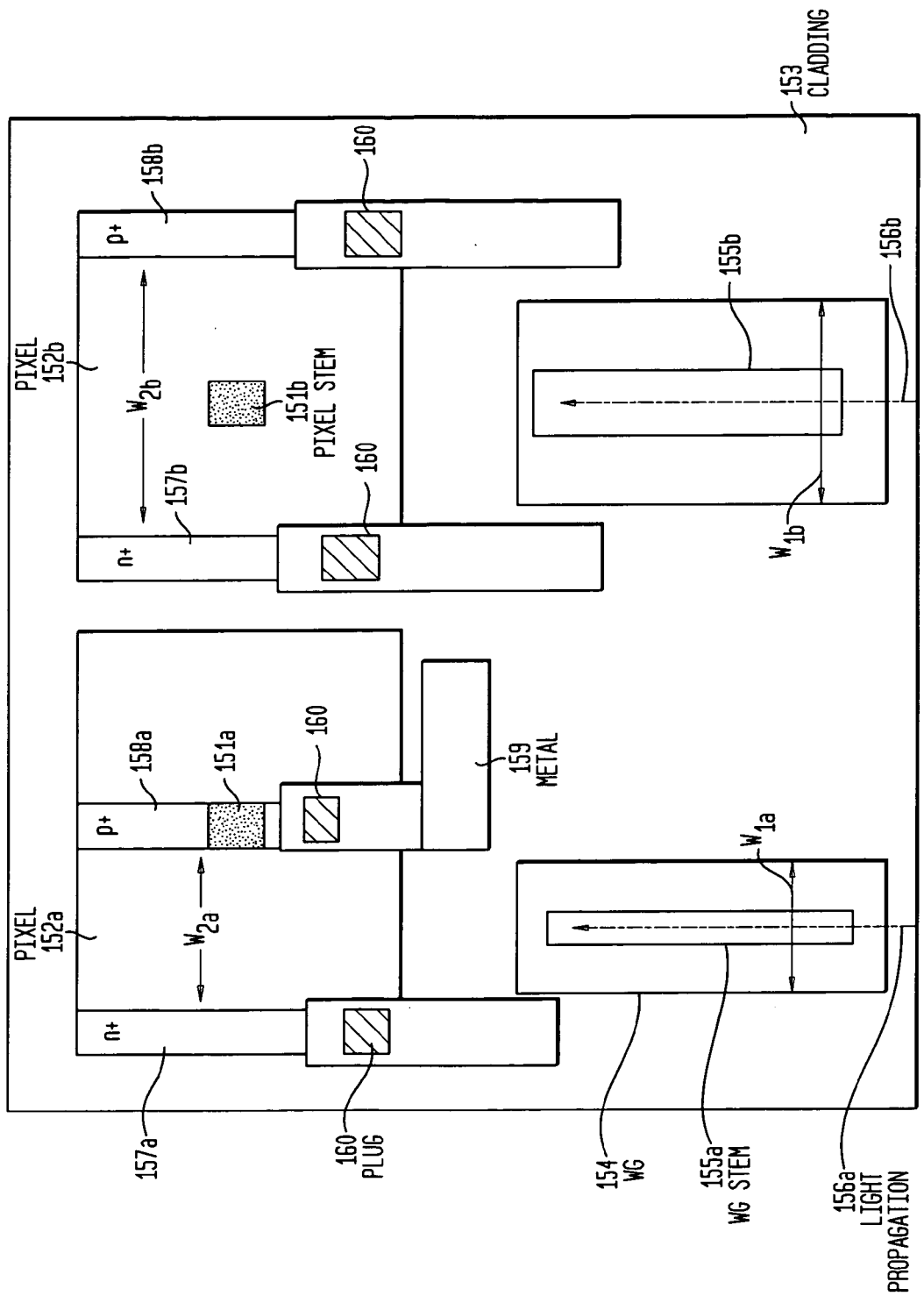
FIG. 9b is a schematic, top view of various mask sets of edge-illuminated PDs illustrating several schemes for enhancing performance in accordance with still other embodiments of our invention.

Turning now to speed considerations of edge-illuminated PDs, FIG. 9b shows in plan-view several possible contacting arrangements for enhancing speed of operation. Unlike the previously described surface-illuminated PDs, it is not necessary to cover the doped contacting regions or the pixel stem regions with metal since incoming signal light is directed to the desired pixel regions (and away from the contacting regions) by means of a WG.

Two different WG-pixel combinations are shown in FIG. 9b. The speed of the edge-illuminated PD is increased by injecting the light into only a portion of the middle of the detector. To accomplish this result the width of the WG section $W_{1a}$ ($W_{1b}$) is made less than the distance $W_{2a}$ ($W_{2b}$) between the inside edges of the doped contacting regions 157a and 158a of pixel 152a (157b and 158b of pixel 152b), and the axis of propagation of the WG is aligned to the center of the pixel portion that lies between the doped contacting regions. In this case, photogeneration of carriers occurs only in the portion of the pixel between the doped contacting regions, and, therefore, the maximum carrier transit time to the edges is reduced compared to the case in which the pixel is uniformly illuminated. Furthermore this type of alignment ensures that the light is kept out of the highly doped contacting regions where diffusion times would be long. This design of the WG and pixel also increases QY since the pixel is able to capture more of the signal light that diffracts from the end of the WG aperture. In addition, the offset design of pixel 142a, with the p+-type contacting region covering the stem region 151a, ensures that no significant amount of injected signal light 156a will be absorbed in the stem region 151a, which tends to be optically lossy. However, if the width of the stem region (as measured transverse to the direction of light propagation) is made less than one half of the wavelength of light in the stem region material, very little light will penetrate into the stem region. In this case the stem region need not be offset; it may be located anywhere in the pixel region where signal light 156b is absorbed (e.g., in the center of the pixel, as shown by stem region 151b of pixel 152b). Therefore, a further feature of this embodiment of our invention is that the width of the stem region is less than one half the wavelength of signal light in the material of the stem region.

Another feature of the embodiment of our invention utilizing pixel 152a is that the width $W_{1a}$ of the WG should be less than the width $W_{2a}$ of the pixel, and that the propagation of the WG should be aligned to the center of the pixel. In pixel 152a the propagation axis of the WG 154 is aligned between the edge of the pixel and the stem region (i.e., between the inside edge of the n+-type contacting region 157a and the stem region 151a). This feature ensures that no significant amount of light is absorbed in the stem region 151a.

PD Contact Configurations: Limiting Dark Current

Another aspect of the current invention relates to PD contact configurations that reduce dark currents. These designs are illustrated in FIG. 10.

Figure 10A:
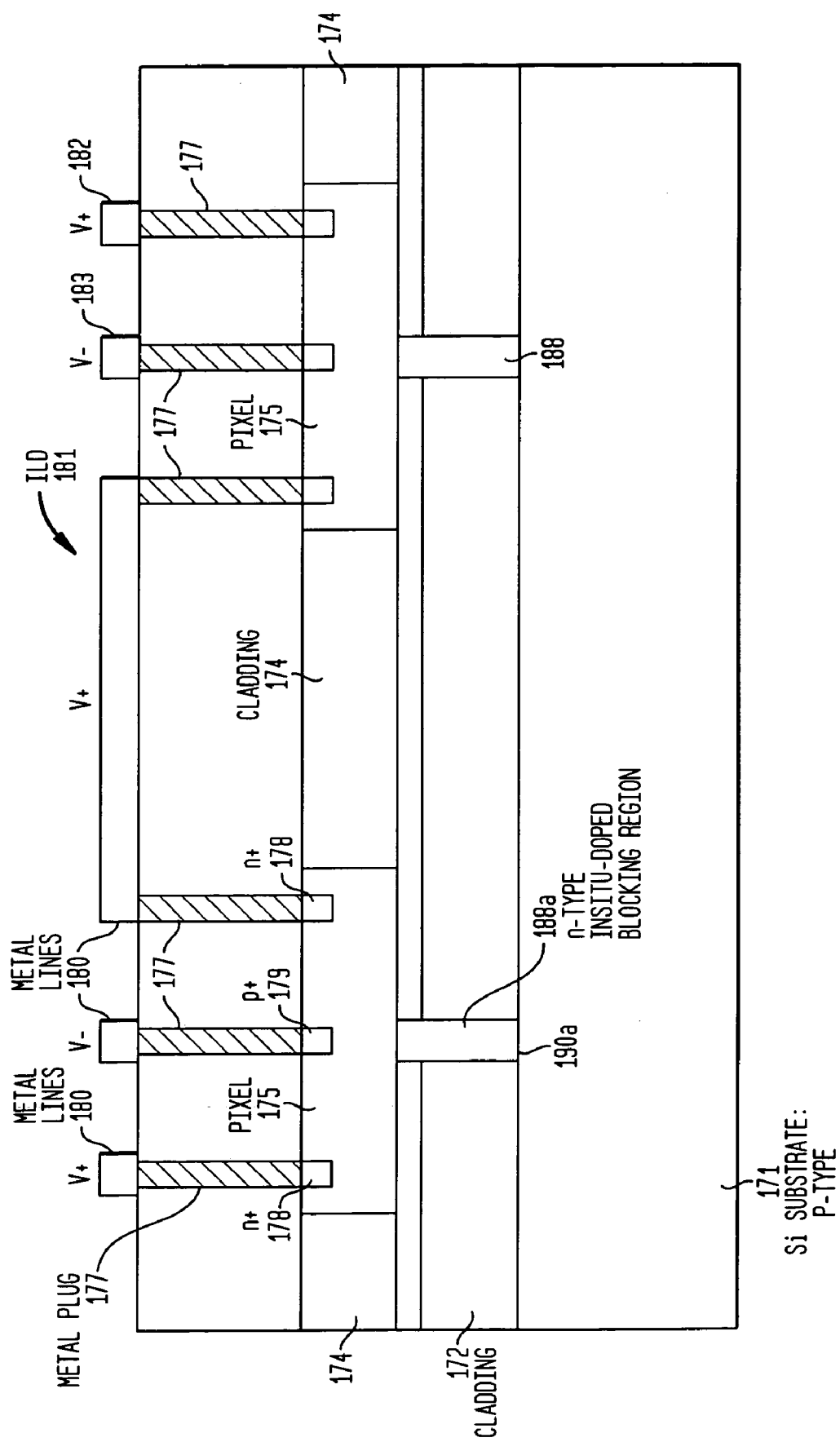
FIG. 10a is a schematic, cross sectional view of a lateral PIN PD having an in situ grown blocking junction in accordance with one more embodiment of our invention.

High doping in the pixel stem region suppresses defect-generated dark currents. Therefore, in accordance with another embodiment of our invention the pixel stem regions are doped with either an n-type or p-type dopant to suppress dark current generation. This doping can be introduced in the stem regions 188a, as shown in FIG. 10a, during the pixel (e.g., SiGe) growth. Here, the stem region 188a is in-situ doped n-type, and the pixel is undoped or low doped. This difference in doping is accomplished, for example, by changing the dopant gas flows during epitaxial growth.

Figure 10B:
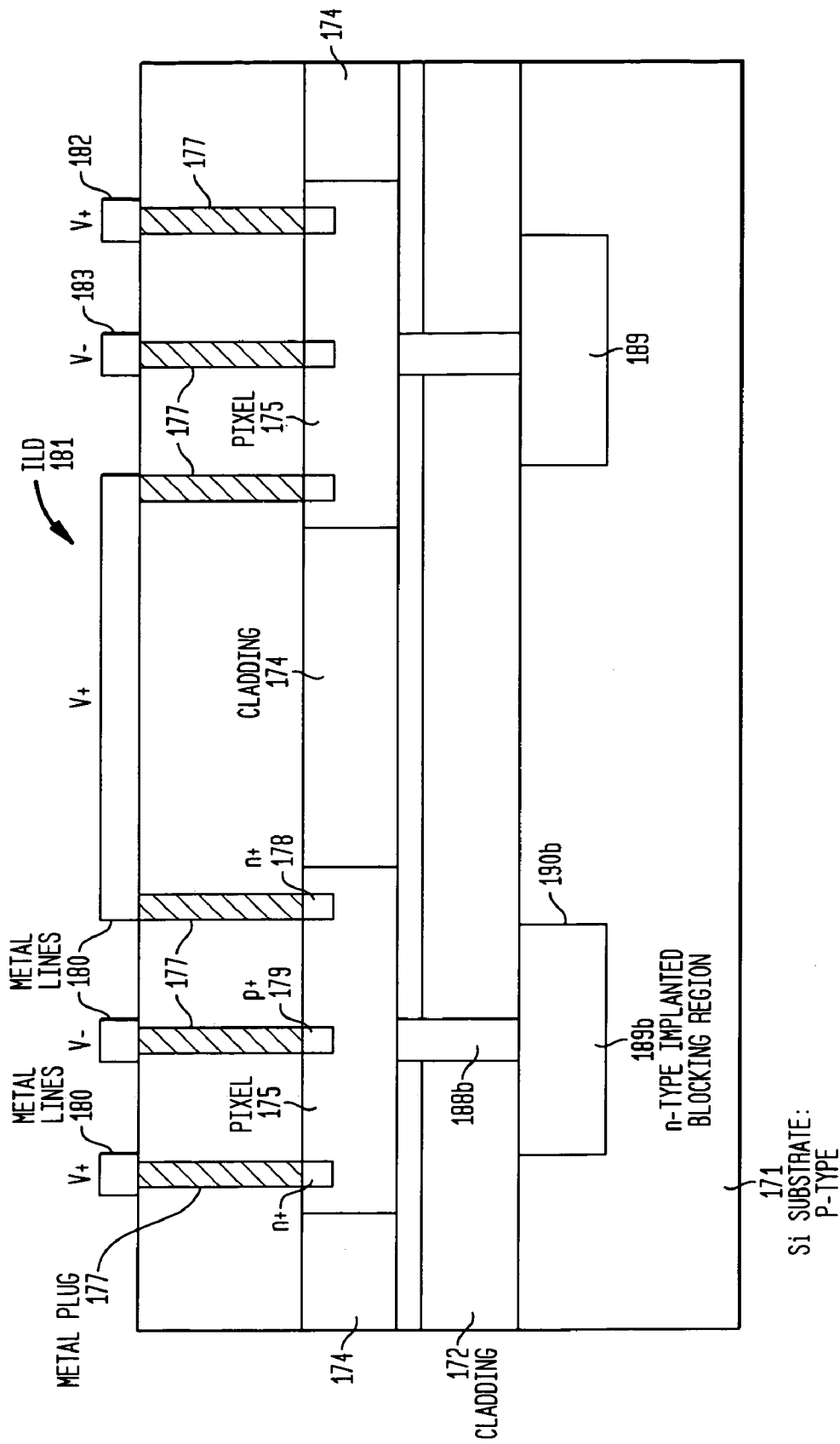
FIG. 10b is a schematic, cross sectional view of a lateral PIN PD having an implanted blocking junction in accordance with still another embodiment of our invention.

Another doping issue is a function of the dopant type of the substrate. Again, with reference to FIG. 10a, if the substrate 171 is contacted and is doped p-type (n-type), a large leakage current can flow from the substrate contact to either the p+-type contact regions 179 (n+-type contact regions 178) in the pixel. For this reason, it is important that a reverse-biased PN junction be positioned between the substrate and the pixel. This junction can be accomplished in two ways. First, as shown in FIG. 10b, a PN junction blocking region 189b is formed in the substrate 171 and under the pixel 175 using ion implantation prior to deposition of the stem cladding region 188b. If the substrate doping is p-type (n-type), a thin n-type (p-type) region 189b should be introduced between the substrate and the pixel region 188b. In this case, the blocking PN junction is defined by the interface 190b between the implanted region 189b and the Si substrate 171. Second, as shown in FIG. 10a, the blocking PN junction is formed through in-situ doping of the pixel 175 and stem region 188a. In this case, the blocking junction is formed at the interface 190a between the n-type stem region 188a and the p-type substrate 171. This design also has the benefit of reducing possible sources of dark current. Therefore, it is also an aspect of the current invention that a PN junction is interposed between the substrate and the low doped body of the pixel.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, surface-illuminated embodiments of our invention may be front (top)-side illuminated, as previously described, or may be back (bottom)-side illuminated. In the latter case, signal light cannot be blocked from entering the doped contacting regions by metal, and so in order to avoid diffusion time limitations, the volume of the doped contacting region should be small; i.e., less than about 25% of the volume of the pixel. Also, in back-illuminated PDs, where the metal electrodes are on the front surface, there are no metal lines to block signal light from entering the stem regions. Therefore, the volume of the stem regions should be kept relatively small; e.g., less than about 25% of the volume of the pixel.

The invention claimed is:

1. A method of making a semiconductor device having at least one predetermined epitaxial region with reduced defect density comprising the steps of:
   (a) forming a dielectric cladding region on a major surface of a single crystal body of a first material;
   (b) forming a first opening that extends to a first depth into the cladding region;
   (c) forming a smaller second opening, within the first opening, that extends to a second depth greater than the first depth and that exposes an underlying portion of the major surface of the single crystal body;
   (d) epitaxially growing regions of a second semiconductor material in each of the openings and on the top of the cladding region;
   (e) controlling the dimensions of the second opening so that defects tend to be confined to a first epitaxial stem region grown within the second opening and to epitaxial regions overgrown on top of the cladding region, a first predetermined region being located within the first opening and being essentially free of defects;
   (f) planarizing the top of the device to remove all epitaxial overgrown regions that extend above the top of the cladding layer, thereby making the top of the first predetermined region grown in the second opening essentially flush with the top of the cladding region; and
   (g) performing additional steps to complete the fabrication of the device.

2. The method of claim 1 wherein the first material comprises Si and wherein step (d) grows the second material as $Si_{1-x}Ge_x$ with $0<x\leq 1$.

3. The method of claim 2 wherein $x\geq 0.1$.

4. The method of claim 3 wherein $x\geq 0.5$.

5. The method of claim 4 wherein $x\cdot 0.8$-$0.9$.

6. The method of claim 1 wherein in step (b) and step (c) the first and second openings are formed so as to have symmetric shapes of their cross-sections parallel to the major surface.

7. The method of claim 6 wherein in step (b) and step (c) the first and second openings are formed so as to have essentially square shapes of their cross-sections parallel to the major surface.

8. The method of claim 7 wherein the first material comprises Si, step (d) grows the second material as $Si_{1-x}Ge_x$ with $0<x\leq 1$, and in step (e) the dimensions of the second opening are controlled so the ratio of its height to each of its width dimensions is greater than about 1.7.

9. The method of claim 1 wherein in planarizing step (f) the device is subject to damascene planarization.

10. The method of claim 1 wherein the predetermined region is formed as the active region of the device.

11. The method of claim 1 further including, before step (f), the additional steps of:
    (h) forming an elongated third opening that extends to a third depth into the cladding region;
    (i) forming a smaller fourth opening, within the third opening, that extends to a fourth depth greater than the third depth and that exposes an underlying portion of the major surface of the single crystal body;
    (j) epitaxially growing regions of a third semiconductor material in each of the openings and on the top of the cladding region;
    (k) controlling the dimensions of the fourth opening so that defects tend to be confined to a second epitaxial stem region grown within the fourth opening and on top of the cladding region, a second predetermined region being located within the third opening and being essentially free of defects.

12. The method of claim 11 wherein the device is formed as an edge-illuminated photodetector in which the first predetermined region is the active region in which light to be detected is absorbed and the second predetermined region is a waveguide region that delivers the light to be detected along a propagation axis to the active region.

13. The method of claim 12 for fabricating an edge-illuminated photodetector wherein the active region and the waveguide region are formed as $Si_{1-x}Ge_x$ regions with $0<x\leq 1$ and the mole fraction of Ge in the waveguide region is made to be less than that in the active region.

14. The method of claim 13 for fabricating an edge-illuminated photodetector wherein the waveguide region is formed with x less than about 0.2.

15. The method of claim 12 for fabricating an edge-illuminated photodetector wherein the active and waveguide regions are formed so that they are separated from one another by a gap, the length of which is approximately equal to an even multiple of half wavelengths of the wavelength of light to be detected by the photodetector as measured in the material of the gap.

16. The method of claim 12 for fabricating an edge-illuminated photodetector wherein the width of the waveguide region is made to be less than the width of the active region, and the propagation axis of the waveguide region is aligned with the center of the active region.

17. The method of claim 12 for fabricating an edge-illuminated photodetector wherein the width of the waveguide region is made to be less than the distance between the outside edge of the active region and the nearest edge of the first stem region, and the propagation axis of the waveguide region is aligned with the center of the active region.

18. The method of claim 12 for fabricating an edge-illuminated photodetector wherein the width of the first stem region is made to be less than one half the wavelength of the light to be detected as measured in the material of the stem region.

19. The method of claim 1 wherein the device is formed as a photodetector in which the first predetermined region is an active region in which light to be detected is absorbed.

20. The method of claim 19 wherein the device is formed as a surface-illuminated photodetector that includes an array of said active regions.

21. The method of claim 20 for fabricating a surface-illuminated photodetector further including, before planarizing step (f), the additional step of forming a dielectric mirror on at least the top of the active region.

22. The method of claim 21 for fabricating a surface-illuminated photodetector wherein growing step (d) includes growing a multiplicity of semiconductor layers in the second opening so as to form a second dielectric mirror at the bottom of the active region.

23. The method of claim 20 for fabricating a surface-illuminated photodetector further including the step of forming an anti-reflection coating on the top of the active region.

24. The method of claim 19 for fabricating a photodetector wherein step (g) includes forming a multiplicity of electrical contacts on the top surface of photodetector, the contacts being electrically coupled to the active region where light to be detected is made incident.

25. The method of claim 24 for fabricating a surface-illuminated photodetector having an array of active regions and wherein step (g) forms the contacts as Schottky barrier contacts to each active region, within each active region alternate ones of the contacts being connectable to opposite polarity voltage supplies.

26. The method of claim 24 for fabricating a surface-illuminated photodetector having an array of active regions and corresponding first stem regions and wherein step (g) forms electrical contacts on the top surface of the device that are effective to block light from penetrating into the first stem regions.

27. The method of claim 19 for fabricating a photodetector wherein growing step (d) forms the active region with a doping level less than about $10^{17}$ cm$^{-3}$, and step (g) includes the steps of: implanting dopant ions into the active region so as to form therein a multiplicity of separated, more highly doped n-type and p-type contacting regions.

28. The method of claim 27 for fabricating a photodetector wherein the dopant level in the contacting regions is greater than about $10^{18}$ cm$^{-3}$.

29. The method of claim 27 for fabricating a photodetector wherein step (g) includes the steps of: forming an insulating interlevel dielectric region over the device, opening windows in the interlevel region to expose at least a portion of each of the contacting regions, filling the windows with metal plugs that contact the exposed portions, and forming on the top surface of the interlevel region electrodes that contact each of the plugs.

30. The method of claim 29 for fabricating a photodetector wherein in step (g) the contacting regions are formed so that, within the active region, no adjacent contacting regions have the same conductivity type.

31. The method of claim 29 for fabricating a photodetector wherein in step (g) the electrodes are designed so that, within the active region, no adjacent contacting regions are connected to the same polarity voltage supply.

32. The method of claim 19 for fabricating a photodetector wherein step (g) includes the steps of: implanting dopant ions into the active region so as to form therein a multiplicity of separated, more highly doped n-type and p-type contacting regions such that the total volume of all of the contacting regions within the active region is less than about 25% of the volume of the active region.

33. The method of claim 19 for fabricating a photodetector wherein step (g) includes the steps of: implanting dopant ions into the active region so as to form therein a multiplicity of separated, highly doped n-type and p-type contacting regions and forming metal contacts to the contacting regions such that the metal contacts cover at least about 30% of the top surface area of the aggregate of the contacting regions.

34. The method of claim 33 for fabricating a photodetector wherein step (g) includes forming the metal contacts so that they also cover at least about 20% of the top surface area of the active region between the contacting regions.

35. The method of claim 19 for fabricating a photodetector wherein step (b), step (c) and step (d) are mutually adapted so that volume of the stem region is made to be less than about 25% of the volume of the active region.

36. The method of claim 1 wherein step (a) includes the steps of forming a stack of at least three insulative layers including a first cladding layer on the major surface, a stop etch layer on the first layer, and a second cladding layer on the stop etch layer.

37. The method of claim 36 including, between forming step (c) and growing step (d), the additional steps of: forming a conformal dielectric layer on the top of the cladding region and on the walls and bottom of the openings, and anisotropically etching away the portion of the conformal layer on the bottom of the second opening.

38. The method of claim 1 including the step of forming a blocking p-n junction between the substrate and the active region.

39. The method of claim 1 wherein the device is formed as a MOSFET having source, drain and channel regions located within the predetermined region.

* * * * *

UNITED STATES PATENT AND TRADEMARK OFFICE
CERTIFICATE OF CORRECTION

PATENT NO. : 7,297,569 B2
APPLICATION NO. : 11/269017
DATED : November 20, 2007
INVENTOR(S) : Jeff D. Bude, Malcolm Carroll and Clifford Alan King Page 1 of 1

It is certified that error appears in the above-identified patent and that said Letters Patent is hereby corrected as shown below:

Column 2, line 50, delete first occurrence of "approaches."
Column 3, line 4, "through out" should read --throughout--.
Column 7, line 7, delete "is" and insert --being--.
Column 7, line 42, delete the word "the.".
Column 10, line 51, delete the extra space between "layer" and "52.2" on the following line.
Column 12, line 11, "a" should read --at--.
Column 13, line 24, "is" should read --are--.
Column 15, line 40, "be" should read --by--.
Column 18, line 58, after first occurrence of "it" insert --is--.
Column 21, line 59, after "x" insert --≥--.
Column 23, line 18, after "of" insert --the--.
Column 23, line 21, after "method" delete the hyphen "-".

Signed and Sealed this

Eleventh Day of November, 2008

JON W. DUDAS
*Director of the United States Patent and Trademark Office*